United States Patent
Kito et al.

(10) Patent No.: US 8,203,884 B2
(45) Date of Patent: Jun. 19, 2012

(54) NONVOLATILE SEMICONDUCTOR MEMORY DEVICE

(75) Inventors: Masaru Kito, Kanagawa-ken (JP);
Ryota Katsumata, Kanagawa-ken (JP);
Yoshiaki Fukuzumi, Kanagawa-ken (JP); Masaru Kidoh, Tokyo (JP);
Hiroyasu Tanaka, Tokyo (JP); Yosuke Komori, Mie-ken (JP); Megumi Ishiduki, Kanagawa-ken (JP); Tomoko Fujiwara, Kanagawa-ken (JP); Hideaki Aochi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 243 days.

(21) Appl. No.: 12/727,854

(22) Filed: Mar. 19, 2010

(65) Prior Publication Data
US 2011/0019480 A1 Jan. 27, 2011

(30) Foreign Application Priority Data
Jul. 21, 2009 (JP) .................................. 2009-169952

(51) Int. Cl.
*G11C 16/04* (2006.01)
*H01L 29/788* (2006.01)
*H01L 29/792* (2006.01)

(52) U.S. Cl. ......... 365/185.18; 365/185.01; 365/185.29; 365/185.33; 257/316; 257/324; 257/E21.614; 257/E29.3

(58) Field of Classification Search .............. 365/185.18
See application file for complete search history.

(56) References Cited

U.S. PATENT DOCUMENTS

| 2007/0252201 A1 | 11/2007 | Kito et al. |
| 2009/0268523 A1* | 10/2009 | Maejima ................. 365/185.11 |
| 2010/0097858 A1* | 4/2010 | Tokiwa et al. ........... 365/185.05 |

FOREIGN PATENT DOCUMENTS

| JP | 2007-266143 | 10/2007 |
| JP | 2009-146954 | 7/2009 |
| WO | WO 2009/075370 A1 | 6/2009 |

OTHER PUBLICATIONS

U.S. Appl. No. 12/943,349, filed Nov. 10, 2010, Katsumata, et al.

* cited by examiner

*Primary Examiner* — Son Mai
(74) *Attorney, Agent, or Firm* — Oblon, Spivak, McClelland, Maier & Neustadt, L.L.P.

(57) ABSTRACT

A nonvolatile semiconductor memory device, includes: a stacked structural unit including electrode films alternately stacked with inter-electrode insulating films; a first and second semiconductor pillars piercing the stacked structural unit; a connection portion semiconductor layer to electrically connect the first and second semiconductor pillars; a connection portion conductive layer opposing the connection portion semiconductor layer; a memory layer, an inner insulating film, and an outer insulating film provided between the first and second semiconductor layers and the electrode films and between the connection portion semiconductor layer and the connection portion conductive layer. At least a portion of a face of the connection portion conductive layer opposing the outer insulating film is a curved surface having a recessed configuration on a side of the outer insulating film.

20 Claims, 14 Drawing Sheets

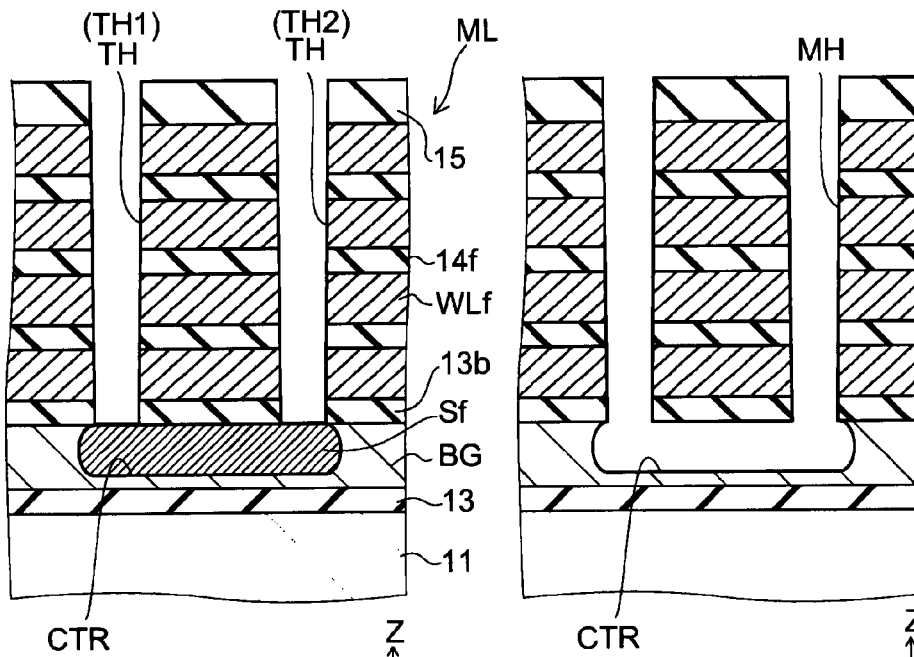
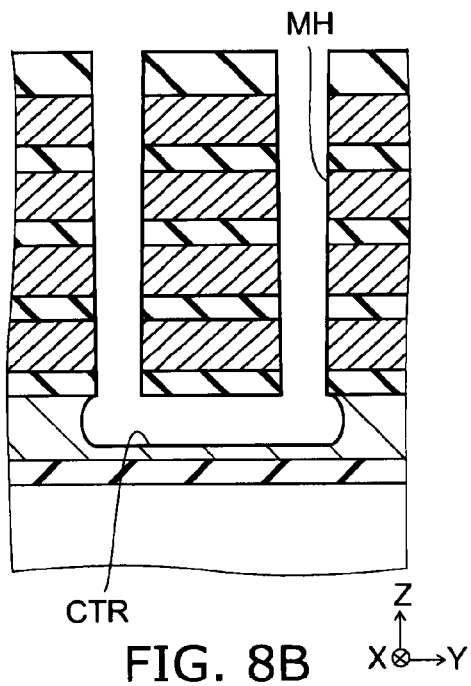
FIG. 8A   FIG. 8B
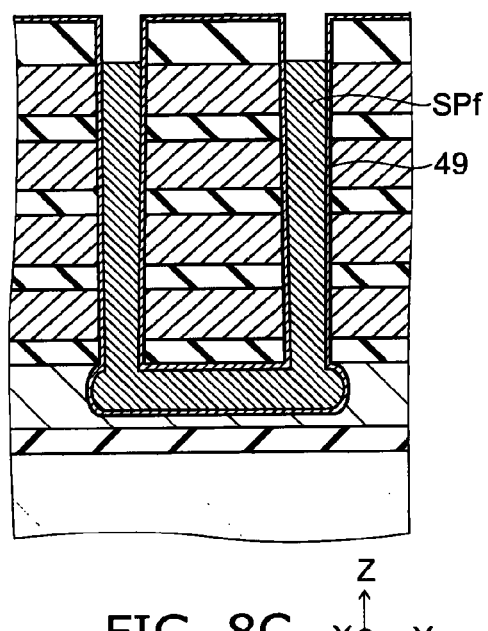
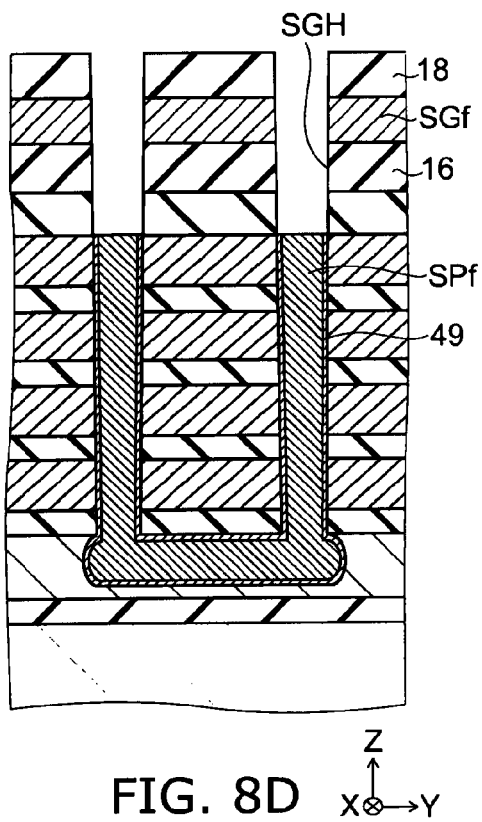
FIG. 8C   FIG. 8D

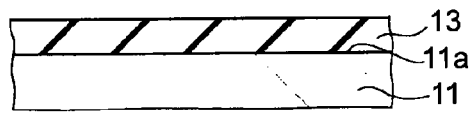
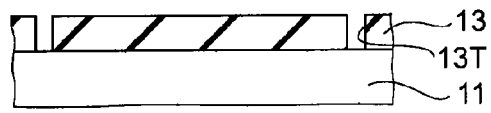
FIG. 9A　　　　　　　FIG. 9B
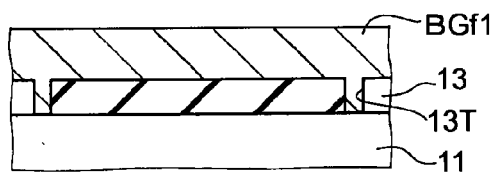
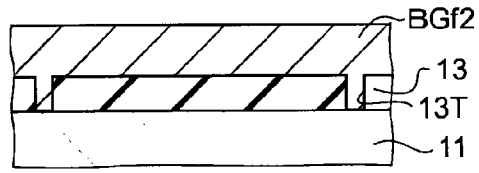
FIG. 9C　　　　　　　FIG. 9D
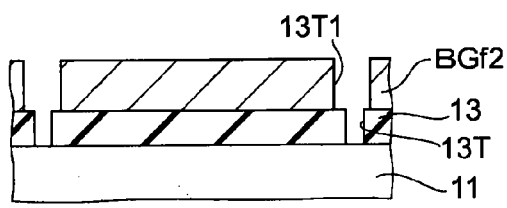
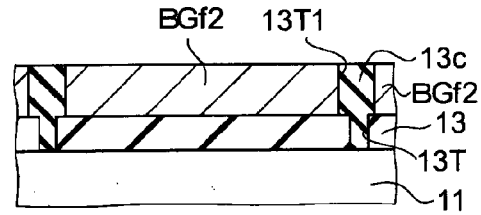
FIG. 9E　　　　　　　FIG. 9F
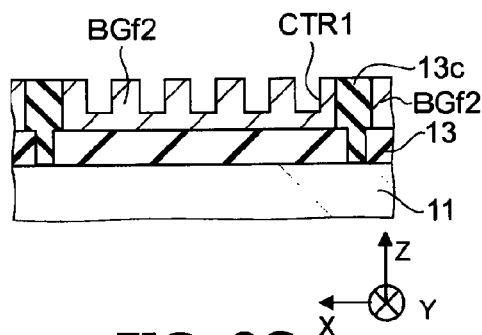
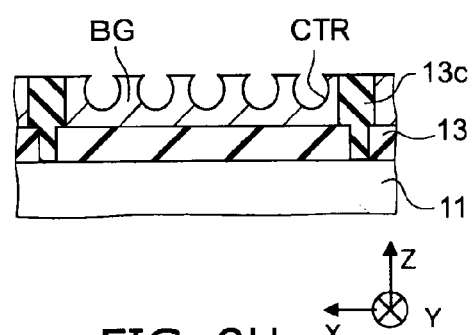
FIG. 9G　　　　　　　FIG. 9H

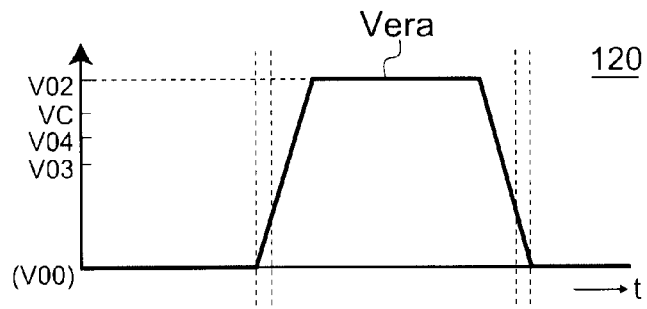
FIG. 11A  VBL/VSL
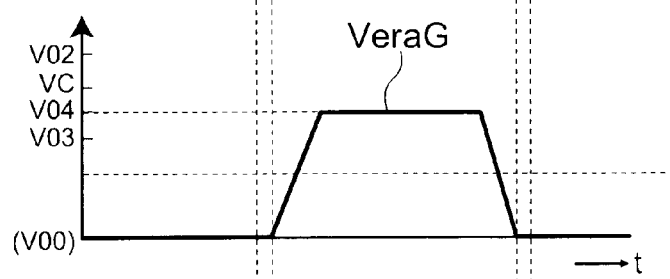
FIG. 11B  VSGD/VSGS
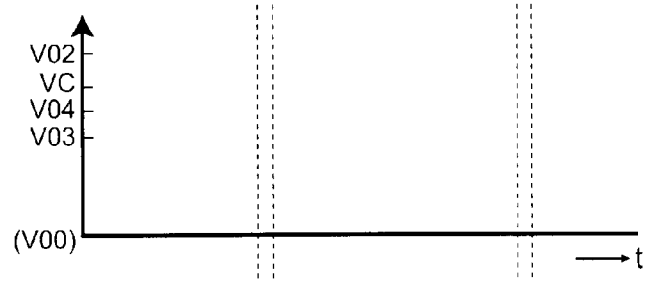
FIG. 11C  VWL
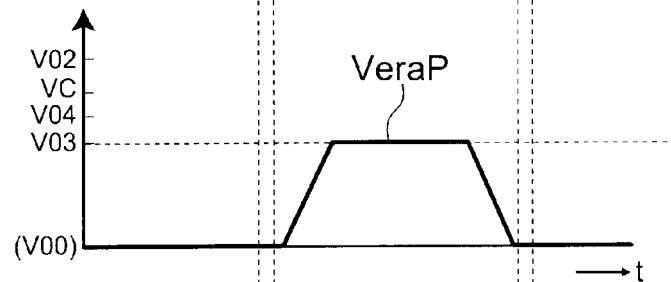
FIG. 11D  VBG
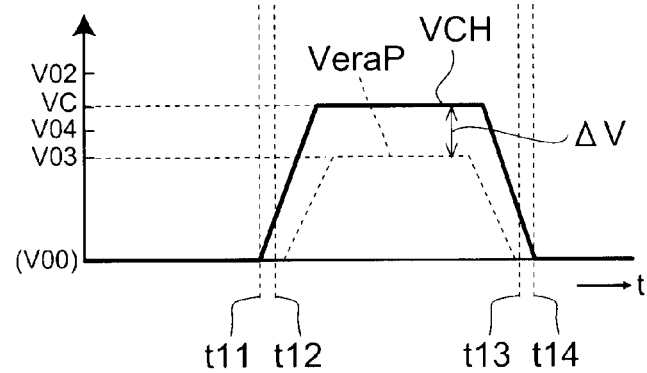
FIG. 11E  VCH

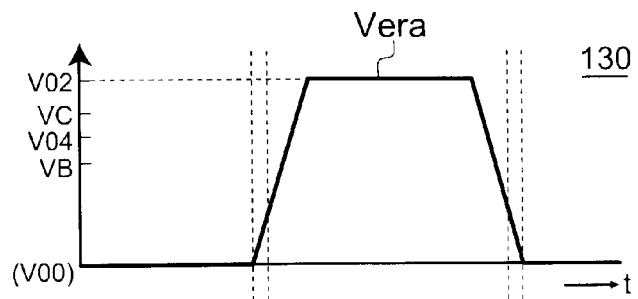
FIG. 14A  VBL/VSL
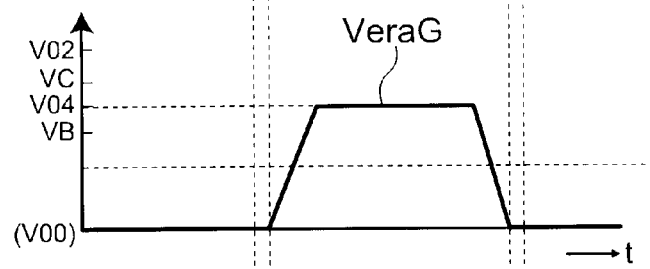
FIG. 14B  VSGD/VSGS
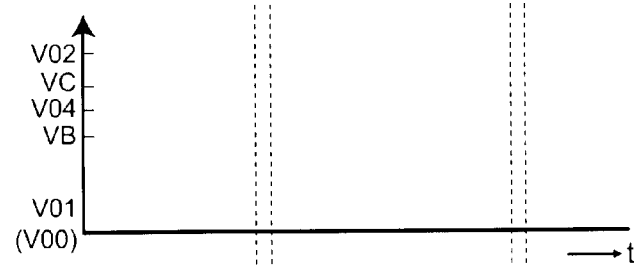
FIG. 14C  VWL
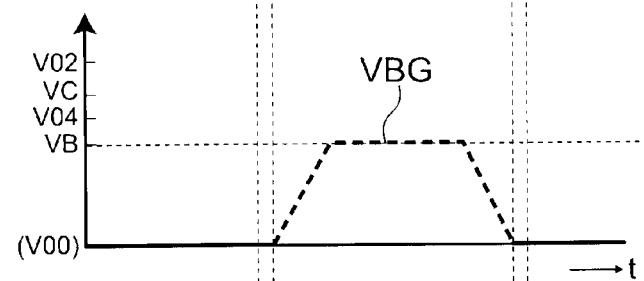
FIG. 14D  VBG
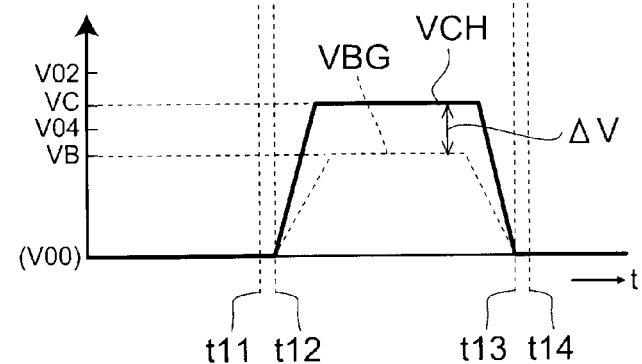
FIG. 14E  VCH

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-169952, filed on Jul. 21, 2009; the entire contents of which are incorporated herein by reference.

BACKGROUND

1. Field

Embodiments of the invention relate generally to a nonvolatile semiconductor memory device.

2. Background Art

Collectively patterned three dimensionally stacked memory cells have been proposed to increase the memory capacities of nonvolatile semiconductor memory devices (memory) (for example, refer to JP-A 2007-266143 (Kokai)). According to such methods, it is possible to suppress cost increases because a stacked memory can be collectively formed regardless of the number of stacks.

In such a collectively patterned three dimensionally stacked memory, insulating films are alternately stacked with electrode films (forming word lines) to form a stacked unit; and through-holes are collectively made in the stacked unit. A charge storage layer (a memory layer) is formed on the side faces of the through-holes; and silicon is filled into the interiors of the through-holes to form silicon pillars. A tunneling insulating film is provided between the charge storage layer and the silicon pillars; and a blocking insulating layer is provided between the charge storage layer and the electrode films. Thereby, memory cells made of, for example, MONOS (Metal Oxide Nitride Oxide Semiconductor) transistors are formed at the intersections between the silicon pillars and the electrode films.

Further, a silicon pillar having a U-shaped configuration can be formed by using a connection portion provided on the silicon substrate side to connect two of the through-holes. In other words, a through-hole having a U-shaped configuration is made; the blocking insulating layer, the charge storage layer, and the tunneling insulating film are formed on the side wall thereof; and silicon is filled into the remaining space to form a memory string made of the silicon pillar having the U-shaped structure.

SUMMARY

According to an aspect of the invention, there is provided a nonvolatile semiconductor memory device, including: a stacked structural unit including a plurality of electrode films alternately stacked in a first direction with a plurality of inter-electrode insulating films; a first semiconductor pillar piercing the stacked structural unit in the first direction; a second semiconductor pillar adjacent to the first semiconductor pillar in a second direction perpendicular to the first direction, the second semiconductor pillar piercing the stacked structural unit in the first direction; a connection portion semiconductor layer aligned in the second direction to electrically connect the first semiconductor pillar and the second semiconductor pillar on a same side in the first direction; a connection portion conductive layer provided to oppose the connection portion semiconductor layer; a memory layer provided between the first semiconductor pillar and each of the electrode films, between the second semiconductor pillar and each of the electrode films, and between the connection portion conductive layer and the connection portion semiconductor layer; an inner insulating film provided between the memory layer and the first semiconductor pillar, between the memory layer and the second semiconductor pillar, and between the memory layer and the connection portion semiconductor layer; and an outer insulating film provided between the memory layer and each of the electrode films and between the memory layer and the connection portion conductive layer, at least a portion of a face of the connection portion conductive layer opposing the outer insulating film being a curved surface having a recessed configuration on a side of the outer insulating film. According to another aspect of the invention, there is provided a nonvolatile semiconductor memory device, including a memory unit and a control unit, the memory unit including: a stacked structural unit having a plurality of electrode films alternately stacked in a first direction with a plurality of inter-electrode insulating films; a first semiconductor pillar piercing the stacked structural unit in the first direction; a second semiconductor pillar adjacent to the first semiconductor pillar in a second direction perpendicular to the first direction, the second semiconductor pillar piercing the stacked structural unit in the first direction; a connection portion semiconductor layer aligned in the second direction to electrically connect the first semiconductor pillar and the second semiconductor pillar on a same side in the first direction; a connection portion conductive layer provided to oppose the connection portion semiconductor layer; a memory layer provided between the first semiconductor pillar and each of the electrode films, between the second semiconductor pillar and each of the electrode films, and between the connection portion conductive layer and the connection portion semiconductor layer; an inner insulating film provided between the memory layer and the first semiconductor pillar, between the memory layer and the second semiconductor pillar, and between the memory layer and the connection portion semiconductor layer; an outer insulating film provided between the memory layer and each of the electrode films and between the memory layer and the connection portion conductive layer; and an interconnect electrically connected to one end of at least one selected from the first and second semiconductor pillars, the control unit, in an operation of performing at least one selected from injecting an electron hole into the memory layer and removing an electron from the memory layer, sets the connection portion conductive layer to a potential higher than a potential of the electrode films. According to still another aspect of the invention, there is provided a nonvolatile semiconductor memory device, including a memory unit and a control unit, the memory unit including: a stacked structural unit having a plurality of electrode films alternately stacked in a first direction with a plurality of inter-electrode insulating films; a first semiconductor pillar piercing the stacked structural unit in the first direction; a second semiconductor pillar adjacent to the first semiconductor pillar in a second direction perpendicular to the first direction, the second semiconductor pillar piercing the stacked structural unit in the first direction; a connection portion semiconductor layer aligned in the second direction to electrically connect the first semiconductor pillar and the second semiconductor pillar on a same side in the first direction; a connection portion conductive layer provided to oppose the connection portion semiconductor layer; a memory layer provided between the first semiconductor pillar and each of the electrode films, between the second semiconductor pillar and each of the electrode films, and between the connection portion conductive layer and the connection portion semiconductor layer; an inner insulating film provided between the memory layer and the first semiconductor pillar, between the memory layer and the second semiconductor pillar, and between the memory layer and the connection portion semiconductor layer; an outer insulating film provided between the memory layer and each of the electrode films and between the memory layer and the connection portion conductive layer; and an interconnect electrically connected to one end of at least one selected from the first and second semiconductor pillars, the control unit, in an operation of performing at least one selected from injecting an electron hole into the memory layer and removing an electron from the memory layer, sets the connection portion conductive layer to a floating state.

BRIEF DESCRIPTION OF THE DRAWINGS

FIGS. 8A to 8D are schematic cross-sectional views in order of the processes, illustrating the method for manufacturing the nonvolatile semiconductor memory device according to the first embodiment;

FIGS. 9A to 9H are schematic cross-sectional views in order of the processes, illustrating another method for manufacturing the nonvolatile semiconductor memory device according to the first embodiment;

FIGS. 11A to 11E are schematic views illustrating the operations of the nonvolatile semiconductor memory device according to the second embodiment;

FIGS. 14A to 14E are schematic views illustrating the operations of the nonvolatile semiconductor memory device according to the third embodiment.

DETAILED DESCRIPTION

Figure 1A:
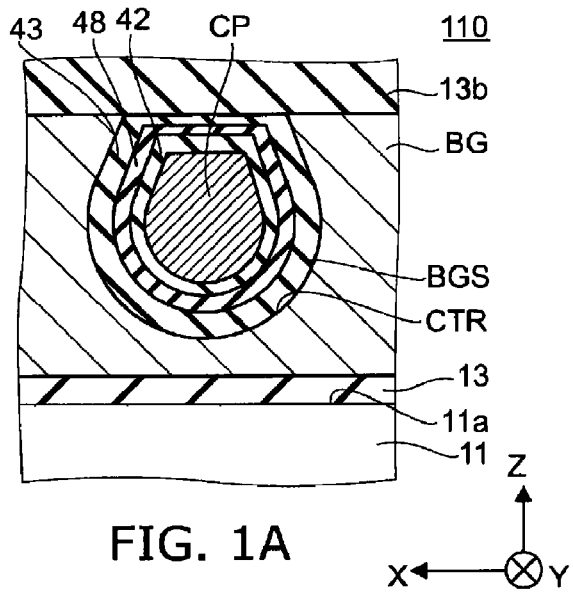
FIGS. 1A to 1C are schematic cross-sectional views illustrating the configuration of a nonvolatile semiconductor memory device according to a first embodiment.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
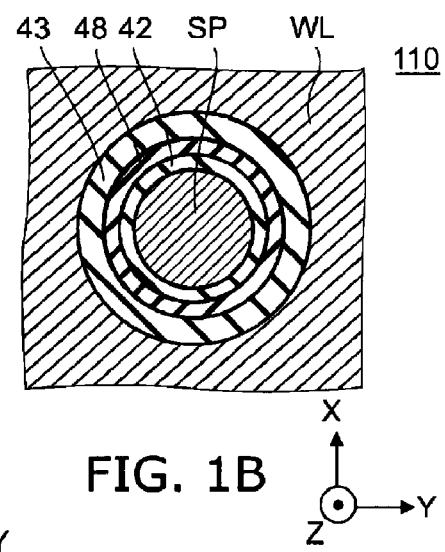
Figure 1C:
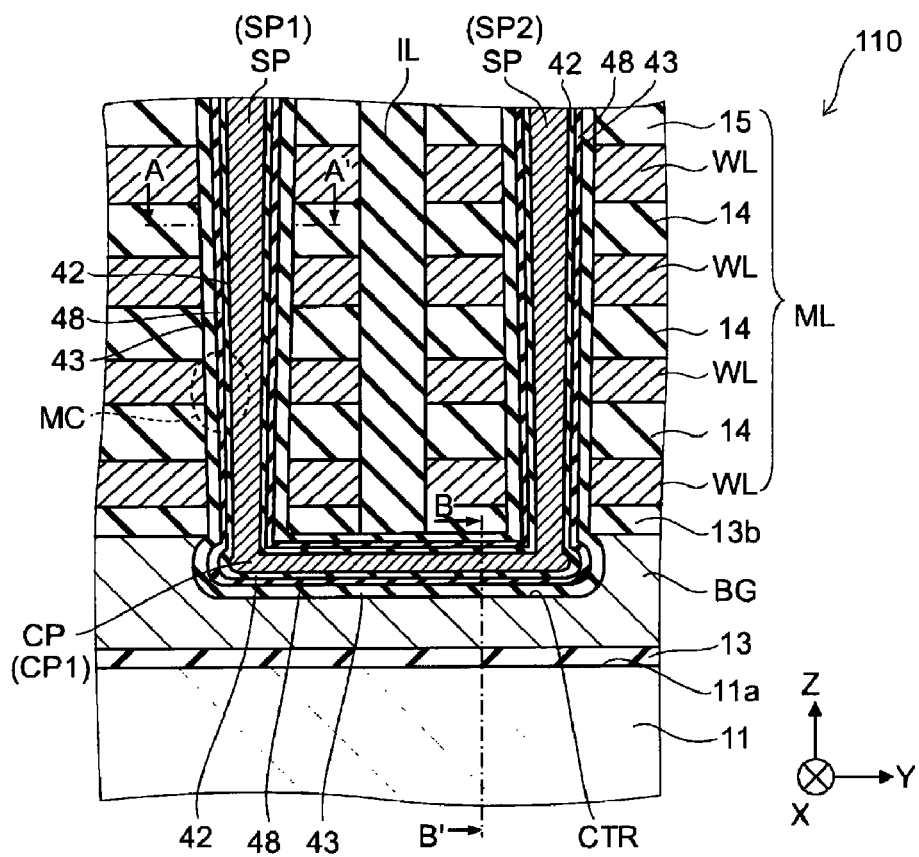

FIGS. 1A to 1C are schematic cross-sectional views illustrating the configuration of a nonvolatile semiconductor memory device according to a first embodiment.

Namely, FIG. 1A is a cross-sectional view along line B-B' of FIG. 1C; and FIG. 1B is a cross-sectional view along line A-A' of FIG. 1C.

Figure 2:
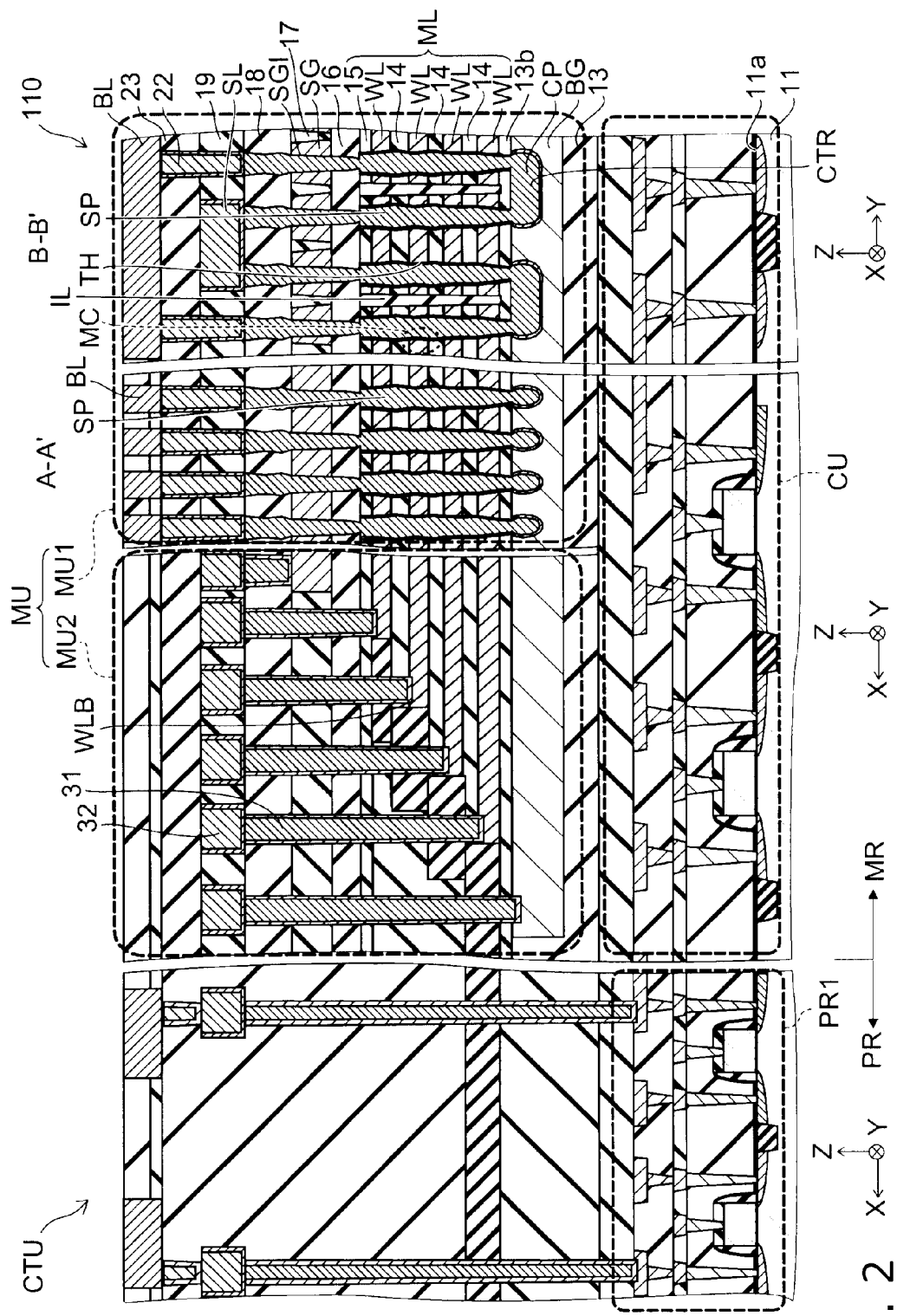
FIG. 2 is a schematic cross-sectional view illustrating the entire configuration of the nonvolatile semiconductor memory device according to the first embodiment.

FIG. 2 is a schematic cross-sectional view illustrating the entire configuration of the nonvolatile semiconductor memory device according to the first embodiment.

Figure 3:
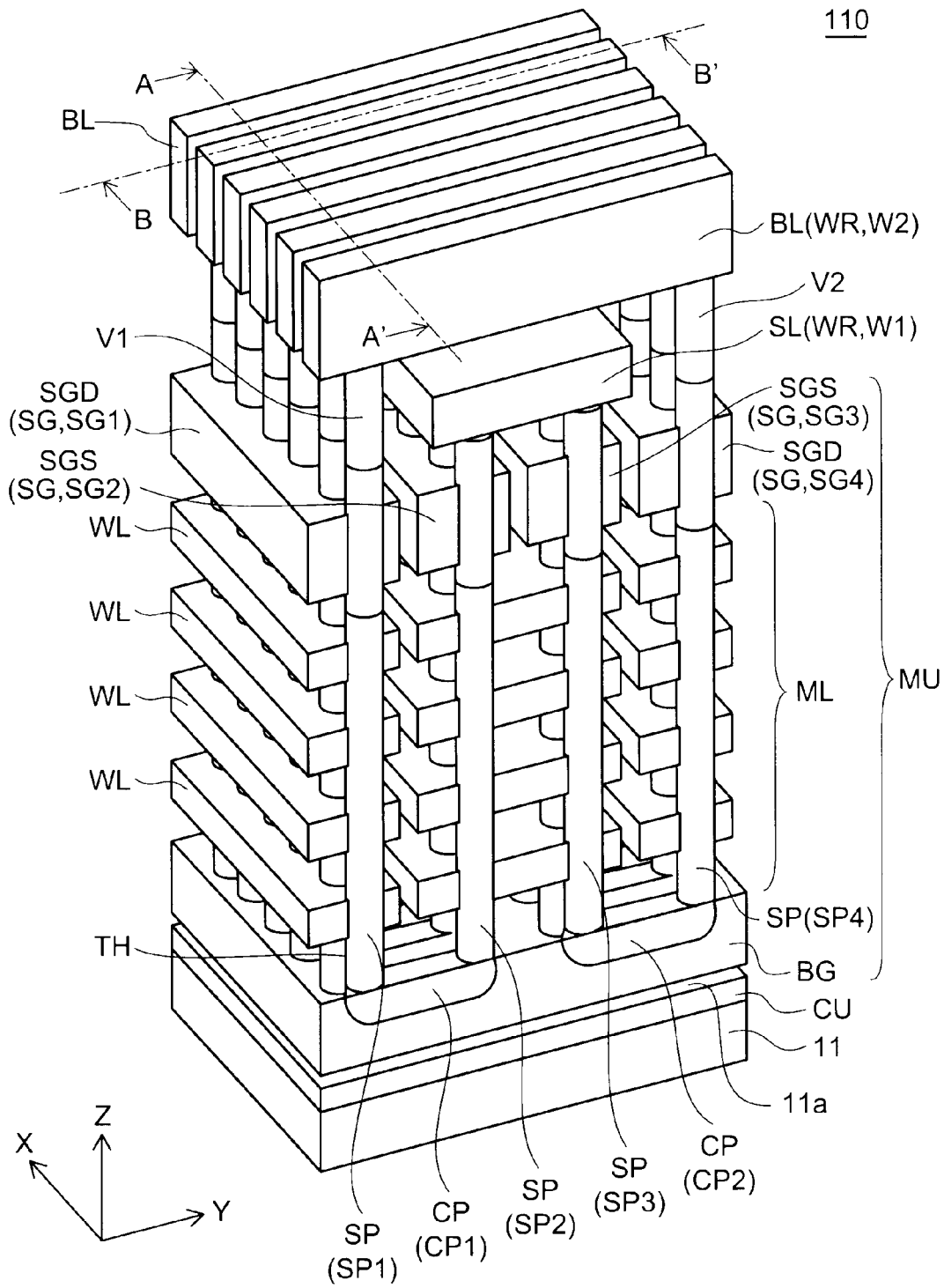
FIG. 3 is a schematic perspective view illustrating the configuration of the nonvolatile semiconductor memory device according to the first embodiment.

FIG. 3 is a schematic perspective view illustrating the configuration of the nonvolatile semiconductor memory device according to the first embodiment.

For easier viewing of the drawing in FIG. 3, only the conductive portions are illustrated, and the insulating portions are omitted.

Figure 4:
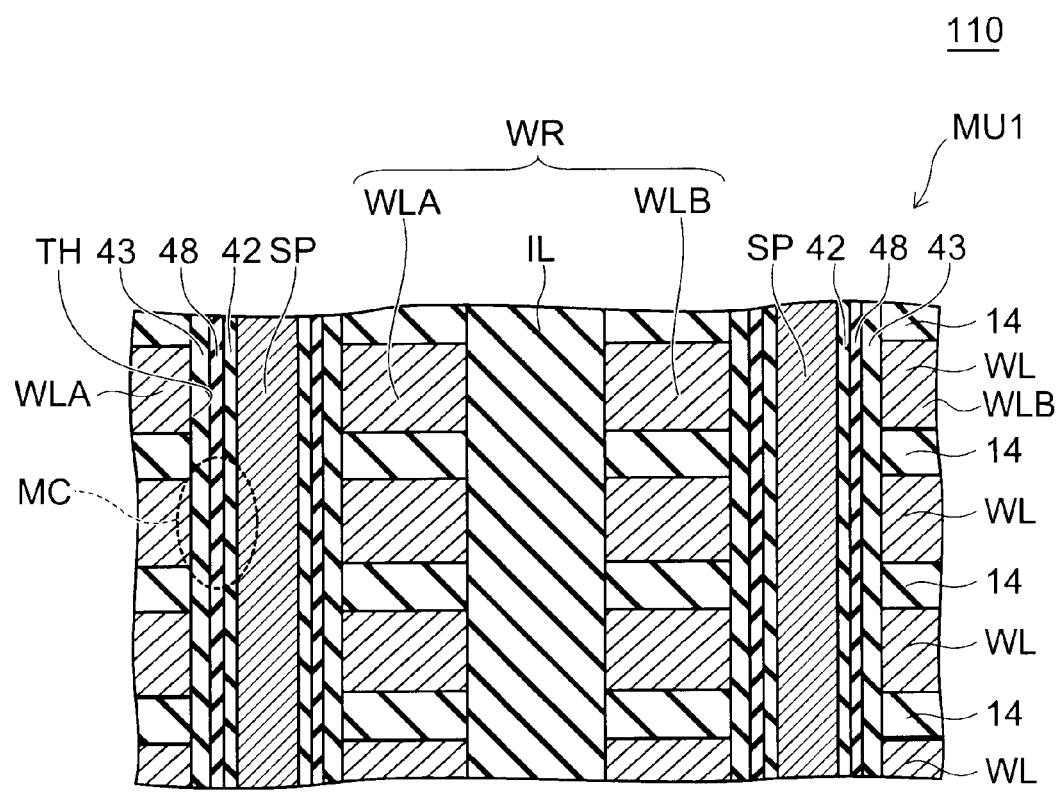
FIG. 4 is a schematic cross-sectional view illustrating the configuration of a portion of the nonvolatile semiconductor memory device according to the first embodiment.

FIG. 4 is a schematic cross-sectional view illustrating the configuration of a portion of the nonvolatile semiconductor memory device according to the first embodiment.

Figure 5:
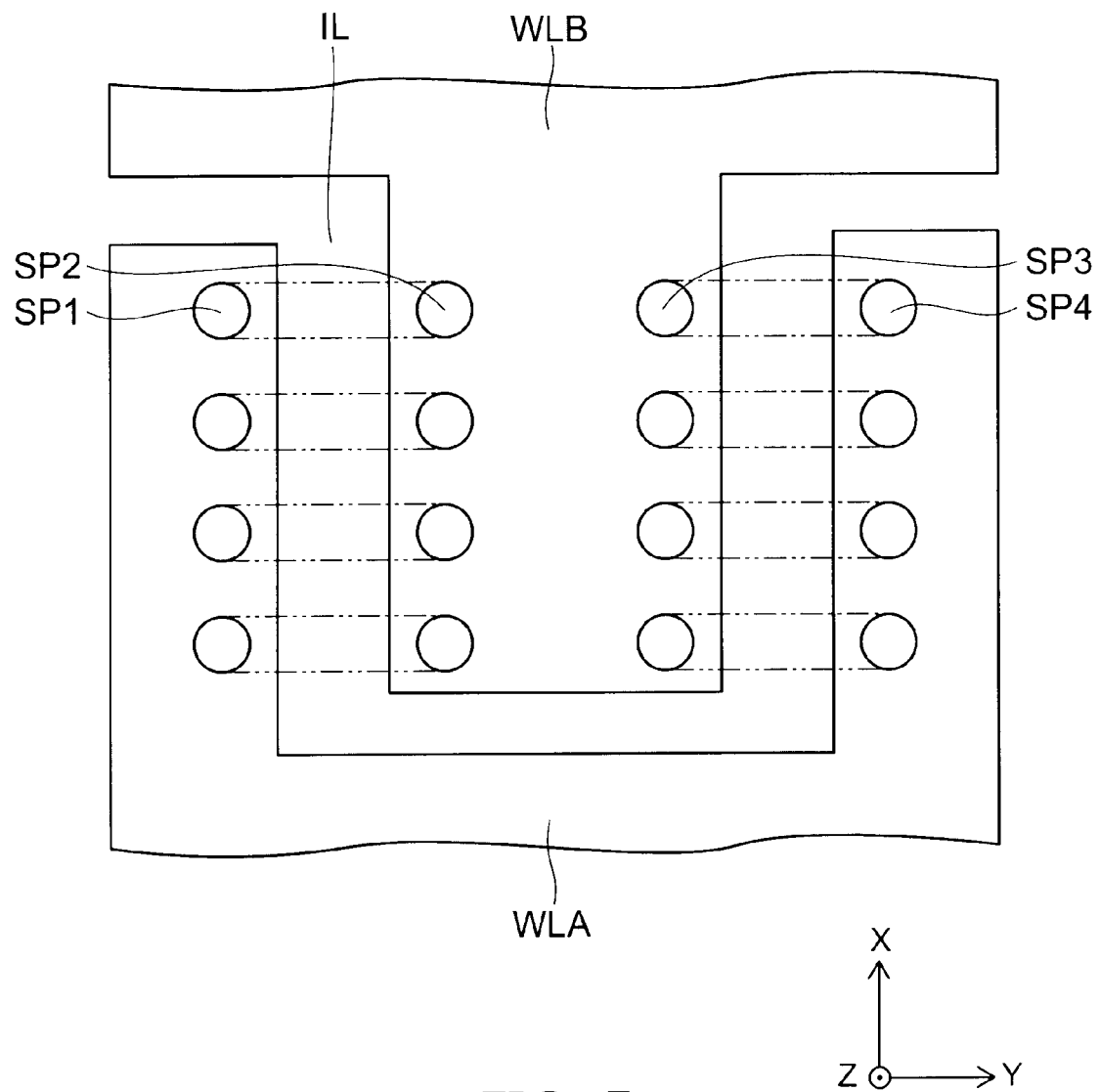
FIG. 5 is a schematic plan view illustrating the configuration of electrode films of the nonvolatile semiconductor memory device according to the first embodiment.

FIG. 5 is a schematic plan view illustrating the configuration of the electrode films of the nonvolatile semiconductor memory device according to the first embodiment.

A nonvolatile semiconductor memory device 110 according to an embodiment of the invention is a three dimensionally stacked flash memory.

First, an overview of the configuration of the nonvolatile semiconductor memory device 110 will be described using FIG. 2 to FIG. 5.

As illustrated in FIG. 2, the nonvolatile semiconductor memory device 110 includes a memory unit MU.

The nonvolatile semiconductor memory device 110 may further include a control unit CTU. The memory unit MU and the control unit CTU may be provided, for example, on a major surface 11a of a semiconductor substrate 11 made of monocrystalline silicon. However, the control unit CTU may be provided on a substrate separate from the substrate on which the memory unit MU is provided. The case will now be described where the memory unit MU and the control unit CTU are provided on the same substrate (the semiconductor substrate 11).

A memory array region MR and a peripheral region PR are set in the semiconductor substrate 11. Memory cells MC, for example, are formed in the memory array region MR; and the peripheral region PR is provided, for example, peripherally to the memory array region MR. In the peripheral region PR, various peripheral region circuits PR1 are provided on the semiconductor substrate 11.

A circuit unit CU, for example, is provided on the semiconductor substrate 11 in the memory array region MR. A memory unit MU is provided on the circuit unit CU. The circuit unit CU may be provided as necessary, and may be omitted. An inter-layer insulating film 13 made of, for example, silicon oxide is provided between the circuit unit CU and the memory unit MU.

At least a portion of the control unit CTU may be provided, for example, in at least one selected from the peripheral region circuit PR1 and the circuit unit CU recited above.

The memory unit MU includes a matrix memory cell unit MU1 and an interconnect connection unit MU2. The matrix memory cell unit MU1 includes multiple memory cell transistors. The interconnect connection unit MU2 connects the interconnects of the matrix memory cell unit MU1.

FIG. 3 illustrates the configuration of the matrix memory cell unit MU1.

Namely, FIG. 2 illustrates a portion of the cross section along line A-A' of FIG. 3 and a portion of the cross section along line B-B' of FIG. 3 as the matrix memory cell unit MU1.

As illustrated in FIG. 2 and FIG. 3, a stacked structural unit ML is provided on the major surface 11a of the semiconductor substrate 11 in the matrix memory cell unit MU1. The stacked structural unit ML includes multiple electrode films WL alternately stacked with multiple inter-electrode insulating films 14 in a direction perpendicular to the major surface 11a.

An XYZ orthogonal coordinate system will now be introduced for convenience of description in the specification of the application. In this coordinate system, a direction perpendicular to the major surface 11a of the semiconductor substrate 11 is taken as a Z axis direction (the first direction). One direction in a plane parallel to the major surface 11a is taken as a Y axis direction (the second direction). A direction perpendicular to the Z axis and the Y axis is taken as an X axis direction (the third direction).

The stacking direction of the electrode films WL and the inter-electrode insulating films 14 in the stacked structural unit ML is the Z axis direction. In other words, the electrode films WL and the inter-electrode insulating films 14 are provided parallel to the major surface 11a. The electrode films WL may be divided, for example, into units of erasing blocks.

FIG. 4 illustrates the configuration of the matrix memory cell unit MU1 and corresponds to, for example, a portion of the cross section along line B-B' of FIG. 3.

As illustrated in FIG. 3 and FIG. 4, the memory unit MU of the nonvolatile semiconductor memory device 110 includes the stacked structural unit ML recited above, a semiconductor pillar SP (a first semiconductor pillar SP1) piercing the stacked structural unit ML in the Z axis direction, a memory layer 48, an inner insulating film 42, an outer insulating film 43, and an interconnect WR.

The memory layer 48 is provided between the semiconductor pillar SP and each of the electrode films WL. The inner insulating film 42 is provided between the memory layer 48 and the semiconductor pillar SP. The outer insulating film 43 is provided between the memory layer 48 and each of the electrode films WL. The interconnect WR is electrically connected to one end of the semiconductor pillar SP. In other words, the outer insulating film 43, the memory layer 48, and the inner insulating film 42 are formed in this order on the wall face of the interior of a through-hole TH piercing the stacked structural unit ML in the Z axis direction; and a semiconductor is filled into the remaining space to form the semiconductor pillar SP.

Memory cells MC are provided at the intersections between the semiconductor pillar SP and the electrode films WL of the stacked structural unit ML. In other words, memory cell transistors including the memory layer 48 are provided in a three dimensional matrix configuration at portions where the electrode films WL intersect the semiconductor pillars SP. By storing charge in the memory layer 48, the memory cell transistors function as the memory cells MC to store data.

The inner insulating film 42 functions as a tunneling insulating film of the memory cell transistor of the memory cell MC. On the other hand, the outer insulating film 43 functions as a blocking insulating layer of the memory cell transistor of the memory cell MC. The inter-electrode insulating film 14 functions as an inter-layer insulating film to insulate between the electrode films WL.

The electrode film WL may include any conductive material. For example, amorphous silicon or polysilicon having an impurity introduced to provide electrical conductivity may be used; and metals, alloys, etc., also may be used. A prescribed electrical signal is applied to the electrode film WL; and the electrode film WL functions as a word line of the nonvolatile semiconductor memory device 110.

The inter-electrode insulating film 14, the inner insulating film 42, and the outer insulating film 43 may include, for example, a silicon oxide film. The inter-electrode insulating film 14, the inner insulating film 42, and the outer insulating film 43 may be single-layer films or stacked films.

The memory layer 48 may include, for example, a silicon nitride film and functions as a portion that stores data by storing or emitting charge due to an electric field applied between the semiconductor pillar SP and the electrode films WL. The memory layer 48 may be a single-layer film or a stacked film.

As described below, the inter-electrode insulating film 14, the inner insulating film 42, the memory layer 48, and the outer insulating film 43 are not limited to the materials recited above. Any material may be used.

Although FIG. 2 and FIG. 3 illustrate the case where the stacked structural unit ML has four layers of the electrode films WL, any number of the electrode films WL may be provided in the stacked structural unit ML. The case of four electrode films WL will now be described.

In this specific example, two of the semiconductor pillars SP are connected by a connection portion CP (the connection portion semiconductor layer).

In other words, the memory unit MU further includes a second semiconductor pillar SP2 (the semiconductor pillar SP) and a first connection portion CP1 (the connection portion CP).

The second semiconductor pillar SP2, for example, is adjacent to the first semiconductor pillar SP1 (the semiconductor pillar SP) in the Y axis direction and pierces the stacked structural unit ML in the Z axis direction. The first connection portion CP1 electrically connects the first semiconductor pillar SP1 and the second semiconductor pillar SP2 on the same side (the side of the semiconductor substrate 11) in the Z axis direction. The first connection portion CP1 is provided to align in the Y axis direction. The first connection portion CP1 includes the same material as the first and second semiconductor pillars SP1 and SP2.

In other words, a back gate BG (the connection portion conductive layer) is provided on the major surface 11a of the semiconductor substrate 11 via the inter-layer insulating film 13. A trench (a trench CTR described below) is made in a portion of the back gate BG opposing the first and second semiconductor pillars SP1 and SP2; the outer insulating film 43, the memory layer 48, and the inner insulating film 42 are formed in the interior of the trench; and the connection portion CP made of a semiconductor is filled into the remaining space. The forming of the outer insulating film 43, the memory layer 48, the inner insulating film 42, and the connection portion CP in the trench recited above may be collectively performed simultaneously with the forming of the outer insulating film 43, the memory layer 48, the inner insulating film 42, and the semiconductor pillar SP in the through-hole TH. Thus, the back gate BG is provided to oppose the connection portion CP.

Thereby, a semiconductor pillar having a U-shaped configuration is formed of the first and second semiconductor pillars SP1 and SP2 and the connection portion CP, thereby forming a NAND string having a U-shaped configuration.

Although the connection portion CP has a function of electrically connecting the first and second semiconductor pillars SP1 and SP2, the connection portion CP also may be utilized as one memory cell. Thereby, the number of memory bits can be increased. The case will now be described where the connection portion CP electrically connects the first and second semiconductor pillars SP1 and SP2 and is not used as a memory unit. Although the memory layer 48 opposing the connection portion CP does not function as a memory unit in such a case, the portion of the memory layer 48 opposing the connection portion CP also is referred to as a memory layer to simplify the description.

As illustrated in FIG. 2 and FIG. 3, the end of the first semiconductor pillar SP1 opposite to the first connection portion CP1 is connected to a bit line BL (a second interconnect W2); and the end of the second semiconductor pillar SP2 opposite to the first connection portion CP1 is connected to a source line SL (a first interconnect W1). The semiconductor pillars SP and the bit lines BL are connected by a via V1 and a via V2. The interconnect WR includes the first interconnect W1 and the second interconnect W2.

In this specific example, the bit line BL is aligned in the Y axis direction; and the source line SL is aligned in the X axis direction.

Between the stacked structural unit ML and the bit lines BL, a drain-side selection gate electrode SGD (a first selection gate electrode SG1, i.e., a selection gate electrode SG) is provided to oppose the first semiconductor pillar SP1; and a source-side selection gate electrode SGS (a second selection gate electrode SG2, i.e., the selection gate electrode SG) is provided to oppose the second semiconductor pillar SP2. Thereby, the desired data can be written to or read from any memory cell MC of any semiconductor pillar SP.

The selection gate electrode SG may include any conductive material. For example, polysilicon or amorphous silicon may be used. In this specific example, the selection gate electrodes SG are divided in the Y axis direction and have band configurations aligned along the X axis direction.

As illustrated in FIG. 2, an inter-layer insulating film 15 is provided in the uppermost portion (the side most distal to the semiconductor substrate 11) of the stacked structural unit ML. An inter-layer insulating film 16 is provided on the stacked structural unit ML; the selection gate electrodes SG are provided thereupon; and an inter-layer insulating film 17 is provided between the selection gate electrodes SG. A through-hole is provided in the selection gate electrode SG; a selection gate insulating film SGI of the selection gate transistor is provided on the inner side face thereof; and a semiconductor is filled onto the inner side thereof. The semiconductor communicates with the semiconductor pillar SP. In other words, the memory unit MU further includes the selection gate electrode SG stacked on the stacked structural unit ML in the Z axis direction and pierced by the semiconductor pillar SP on the interconnect WR (at least one selected from the source line SL and the bit line BL) side.

An inter-layer insulating film 18 is provided on the inter-layer insulating film 17; the source line SL and a via 22 (the via V1 and V2) are provided thereupon; and an inter-layer insulating film 19 is provided around the source line SL. An inter-layer insulating film 23 is provided on the source line SL; and the bit line BL is provided thereupon. The bit line BL has a band configuration along the Y axis.

The inter-layer insulating films 15, 16, 17, 18, 19, and 23 and the selection gate insulating film SGI may include, for example, silicon oxide.

Herein, the semiconductor pillar is multiply provided in the nonvolatile semiconductor memory device 110. "Semiconductor pillar SP" is used to refer to all of the semiconductor pillars or any semiconductor pillar; and "nth semiconductor pillar SPn" (n being any integer not less than 1) is used to refer to a designated semiconductor pillar when describing the relationship among semiconductor pillars, etc.

As illustrated in FIG. 5, for the electrode films WL, the electrode films corresponding to the semiconductor pillars SP(4m+1) and SP(4m+4) are commonly connected to form an electrode film WLA, where m is an integer not less than 0 and n recited above is (4m+1) and (4m+4); and the electrode films corresponding to the semiconductor pillars SP(4m+2) and SP(4m+3) are commonly connected to form an electrode film WLB, where n is (4m+2) and (4m+3). In other words, the electrode films WL have a configuration in which the electrode film WLA and the electrode film WLB are combined with each other in a comb teeth configuration opposing in the X-axis direction.

As illustrated in FIG. 4 and FIG. 5, the electrode film WL is divided by an insulating layer IL; and the electrode film WL is divided into a first region (the electrode film WLA) and a second region (the electrode film WLB).

As illustrated by the interconnect connection unit MU2 illustrated in FIG. 2, the electrode film WLB is connected at one end in the X axis direction to a word line 32 by a via plug 31 and is electrically connected to, for example, a drive circuit provided on the substrate 11. Similarly, the electrode film WLA is connected at the other end in the X axis direction to the word line by the via plug and is electrically connected to the drive circuit. In other words, the length in the X axis direction of each of the electrode films WL (the electrode films WLA and the electrode films WLB) stacked in the Z axis direction changes in a stairstep configuration; and the electrode films WL are electrically connected to the drive circuit by the electrode films WLA at one end in the X axis direction and by the electrode films WLB at the other end in the X axis direction.

As illustrated in FIG. 3, the memory unit MU may further include a third semiconductor pillar SP3 (the semiconductor pillar SP), a fourth semiconductor pillar SP4 (the semiconductor pillar SP), and a second connection portion CP2 (the connection portion CP).

The third semiconductor pillar SP3 is adjacent to the second semiconductor pillar SP2 in the Y axis direction on the side of the second semiconductor pillar SP2 opposite to the first semiconductor pillar SP1 and pierces the stacked structural unit ML in the Z axis direction. The fourth semiconductor pillar SP4 is adjacent to the third semiconductor pillar SP3 in the Y axis direction on the side of the third semiconductor pillar SP3 opposite to the second semiconductor pillar SP2 and pierces the stacked structural unit ML in the Z axis direction.

The second connection portion CP2 electrically connects the third semiconductor pillar SP3 and the fourth semiconductor pillar SP4 on the same side (the same side as the first connection portion CP1) in the Z axis direction. The second connection portion CP2 is provided to align in the Y axis direction to oppose the back gate BG.

The memory layer 48 is provided between the third semiconductor pillar SP3 and each of the electrode films WL, between the fourth semiconductor pillar SP4 and each of the electrode films WL, and between the back gate BG and the second connection portion CP2. The inner insulating film 42 is provided between the memory layer 48 and the third semiconductor pillar SP3, between the memory layer 48 and the fourth semiconductor pillar SP4, and between the memory layer and the second connection portion CP2. The outer insulating film 43 is provided between the memory layer 48 and each of the electrode films WL and between the memory layer 48 and the back gate BG.

The source line SL is connected to a third end portion of the third semiconductor pillar SP3 on the side opposite to the second connection portion CP2. The bit line BL is connected to a fourth end portion of the fourth semiconductor pillar SP4 on the side opposite to the second connection portion CP2.

The source-side selection gate electrode SGS (a third selection gate electrode SG3, i.e., the selection gate electrode SG) is provided to oppose the third semiconductor pillar SP3. The drain-side selection gate electrode SGD (a fourth selection gate electrode SG4, i.e., the selection gate electrode SG) is provided to oppose the fourth semiconductor pillar SP4.

In other words, as illustrated in FIG. 1C, the nonvolatile semiconductor memory device 110 having such a configuration includes the stacked structural unit ML, the first semiconductor pillar SP1, the second semiconductor pillar SP2, the connection portion CP, the memory layer 48, the inner insulating film 42, and the outer insulating film 43 described above. The memory layer 48 is provided between the first semiconductor pillar SP1 and each of the electrode films WL, between the second semiconductor pillar SP2 and each of the electrode films WL, and between the back gate BG and the connection portion CP. The inner insulating film 42 is provided between the memory layer 48 and the first semiconductor pillar SP1, between the memory layer 48 and the second semiconductor pillar SP2, and between the memory layer 48 and the connection portion CP. The outer insulating film 43 is provided between the memory layer 48 and each of the electrode films WL and between the memory layer 48 and the back gate BG.

As illustrated in FIG. 1A, at least a portion of a face BGS of the back gate BG corresponding to the outer insulating film 43 is a curved surface having a recessed configuration on the outer insulating film 43 side. In other words, in the case where a portion of the back gate BG is cut in the X-Z plane, at least a portion of the boundary between the back gate BG and the outer insulating film 43 is a curved line having a recessed configuration on the outer insulating film 43 side. For example, the side face and the bottom face of the back gate BG on the lower side (bottom side) have cylindrical configurations. The bottom face of the back gate BG on the side opposite to the stacked structural unit ML and the side face of the back gate BG are portions of a side face of a cylinder having an axis parallel to the Y axis direction (the second direction). In other words, at least one selected from a side face and a bottom face of the trench CTR is a curved surface.

The outer insulating film 43, the memory layer 48, the inner insulating film 42, and the connection portion CP are stacked. Therefore, at least a portion of the interface between the outer insulating film 43 and the memory layer 48 is a curved surface having a recessed configuration on the memory layer 48 side; at least a portion of the interface between the memory layer 48 and the inner insulating film 42 is a curved surface having a recessed configuration on the inner insulating film 42 side; and at least a portion of the interface between the inner insulating film 42 and the connection portion CP is a curved surface having a recessed configuration on the connection portion CP side.

Thereby, the curvature of the outer insulating film 43 is smaller than the curvature of the inner insulating film 42 at the portion of the connection portion CP. The curvature is the reciprocal of the radius of a circle approximating the boundary. Accordingly, the curvature radius of the outer insulating film 43 is larger than the curvature radius of the inner insulating film 42. Herein, the average of the curvature of the face on the inner side of a film and the curvature of the face on the outer side, for example, may be used as the curvature of the film. In other words, the curvature radius of the film may be taken to be the average of, for example, the curvature radius of the inner side face of the film and the curvature radius of the outer side face.

As a result, the electric field of the outer insulating film 43 is lower than that of the inner insulating film 42. Thereby, reverse injection of electrons into the outer insulating film 43 can be suppressed when erasing; erroneous operations can be suppressed; and the memory operations are stabilized.

Here, the erasing operation is an operation of performing at least one selected from injecting electron holes into the memory layer 48 and removing electrons from the memory layer 48. In other words, the memory cell transistor forming the memory cell MC has a low threshold value state (the erase state) and a state (the write state) in which the threshold value is relatively higher than that of the low threshold value state. The erasing operation is an operation of setting the threshold value of the memory cell transistor to the low side. In the erasing operation, the potential of the electrode film WL is set to a potential lower than the potential of the semiconductor pillar SP forming the channel.

On the other hand, the writing operation is an operation of performing at least one selected from injecting electrons into the memory layer 48 and removing electron holes from the memory layer 48 to set the threshold value of the memory cell transistor to the high side.

Hereinbelow, to simplify the description, the erasing operation is described as performing the injection of electron holes into the memory layer 48.

The cross-sectional configuration of the through-hole TH is, for example, substantially circular (including flattened circles such as ellipses). Thereby, as illustrated in FIG. 1B, the curvature of the outer insulating film 43 is smaller than the curvature of the inner insulating film 42 when a portion of the semiconductor pillar SP is cut in the X-Y plane. In other words, the curvature radius of the outer insulating film 43 is larger than the curvature radius of the inner insulating film 42. Therefore, at a portion of the semiconductor pillar SP as well, the electric field of the outer insulating film 43 is lower than that of the inner insulating film 42; and reverse injection of electrons into the outer insulating film 43 during erasing is suppressed. In other words, in the nonvolatile semiconductor memory device 110, because the semiconductor pillar SP piercing the stacked structural unit ML has a circular columnar configuration, the curvature radius of the blocking insulating layer on the outer side of the memory layer 48 having a circular ring configuration is larger than that of the tunneling insulating film on the inner side; and the electric field of the blocking insulating layer is lower than that of the tunneling insulating film. Therefore, even in the case where the same material such as a silicon oxide film is used as the blocking insulating layer and the tunneling insulating film, reverse injection of electrons into the blocking insulating layer when, for example, the erasing bias is applied does not easily occur; and good erasing characteristics can be provided.

Operations of the nonvolatile semiconductor memory device 110 will now be described in comparison to a comparative example.

FIGS. 6A to 6F are schematic views illustrating characteristics of nonvolatile semiconductor memory devices of the first embodiment and the comparative example.

Figure 6A:
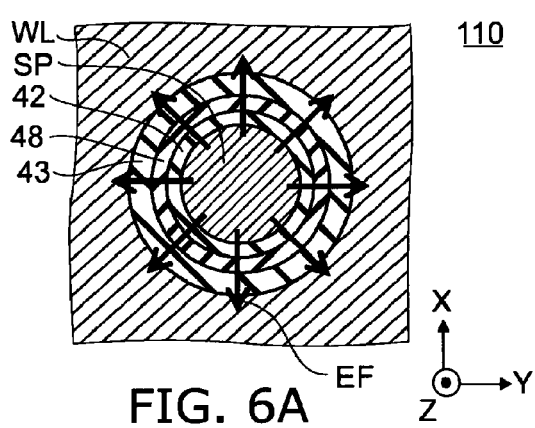
FIGS. 6A to 6F are schematic views illustrating characteristics of nonvolatile semiconductor memory devices of the first embodiment and a comparative example.
Figure 6B:
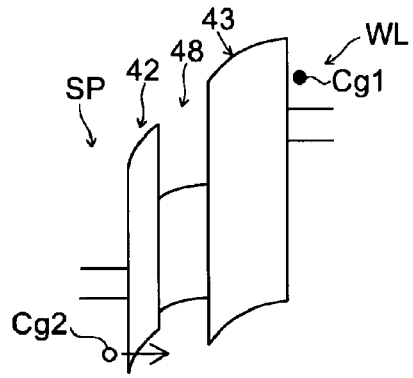
Figure 6C:
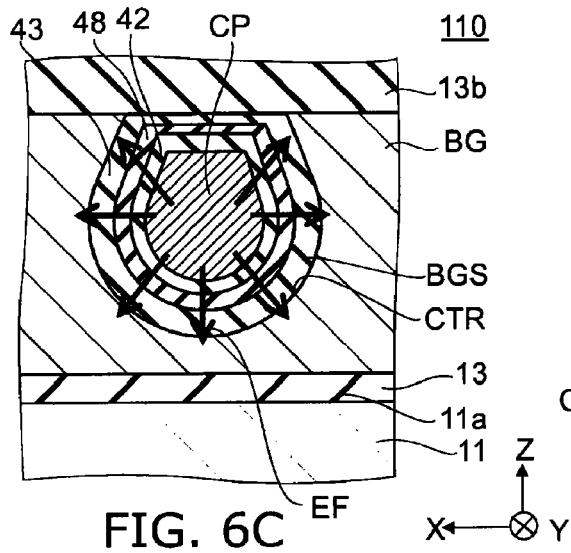
Figure 6D:
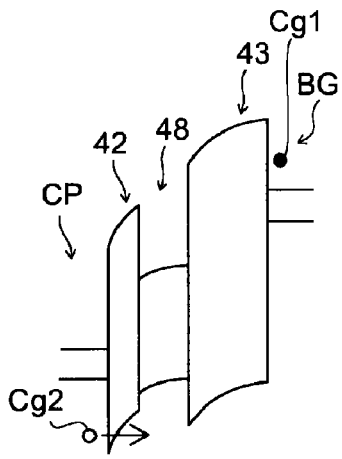

Namely, FIGS. 6A to 6D illustrate characteristics of the nonvolatile semiconductor memory device 110 according to this embodiment. FIGS. 6A and 6C illustrate the appearance of the electric field of the semiconductor pillar SP and the connection portion CP, respectively; and FIGS. 6B and 6D are energy band diagrams of the semiconductor pillar SP and the connection portion CP, respectively.

Figure 6E:
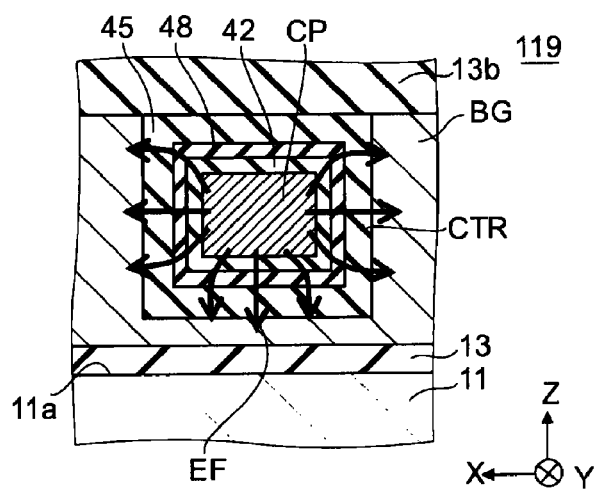
Figure 6F:
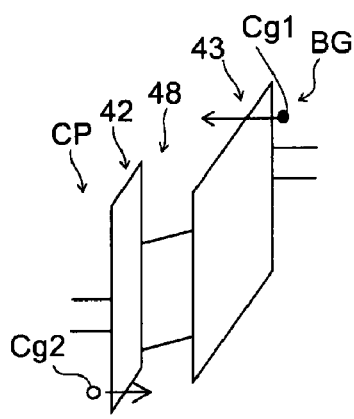

FIG. 6E illustrates the appearance of the electric field of the connection portion CP of a nonvolatile semiconductor memory device 119 of the comparative example; and FIG. 6F is an energy band diagram of the same.

Other than the face (the bottom face and the side face of the trench CTR) of the back gate BG opposing the outer insulating film 43 being planar, the nonvolatile semiconductor memory device 119 of the comparative example has the same configuration as the nonvolatile semiconductor memory device 110 according to this embodiment.

As illustrated in FIG. 6A, in the erasing operation of the nonvolatile semiconductor memory device 110, an erasing bias voltage is applied in which the potential of the semiconductor pillar SP is set relatively higher than that of the electrode film WL. At this time, an electric field EF occurs and spreads radially from the semiconductor pillar SP toward the electrode film WL. The curvature of the outer insulating film 43 is smaller than the curvature of the inner insulating film 42 at a portion of the semiconductor pillar SP. As a result, the electric field EF of the outer insulating film 43 is lower than the inner insulating film 42.

As a result, as illustrated in FIG. 6B, holes Cg2 are injected from the semiconductor pillar SP toward the inner insulating film 42 having a high electric field EF; and the information written to the memory layer 48 is erased. At this time, the electric field EF of the outer insulating film 43 is low. Therefore, electrons Cg1 are not easily injected from the electrode film WL toward the outer insulating film 43.

Thus, by providing a difference between the curvature of the inner insulating film 42 and the curvature of the outer insulating film 43 and providing a difference in the electric fields EF, the reverse injection of the electrons Cg1 into the outer insulating film 43 is suppressed when the erasing bias voltage is applied even in the case where the same material such as a silicon oxide film is used as the inner insulating film 42 and the outer insulating film 43.

In a portion opposing the connection portion CP as well, the curvature of the outer insulating film 43 is smaller than the curvature of the inner insulating film 42; and the electric field EF spreads radially to the outer side (the back gate BG side) from the connection portion CP toward the back gate BG as illustrated in FIG. 6C. As a result, the electric field EF of the outer insulating film 43 is lower than that of the inner insulating film 42.

As a result, as illustrated in FIG. 6D, the injection of electrons from the back gate BG toward the outer insulating film 43 can be suppressed.

On the other hand, in the nonvolatile semiconductor memory device 119 of the comparative example, the side faces and the bottom face of the trench CTR are planar; and the electric field EF of the inner insulating film 42 and the electric field EF of the outer insulating film 43 are parallel to each other at the portion opposing the connection portion CP as illustrated in FIG. 6E. As a result, the electric field EF applied to the outer insulating film 43 is the same as the electric field EF applied to the inner insulating film 42.

As a result, as illustrated in FIG. 6F, simultaneously with the holes Cg2 being injected from the connection portion CP toward the inner insulating film 42, the electrons Cg1 are undesirably injected from the back gate BG into the outer insulating film 43 to which the electric field EF similar to that of the inner insulating film 42 is applied. The electrons Cg1, for example, reach the memory layer 48, are undesirably retained in the memory layer 48, and may cause erroneous operations.

Conversely, in the nonvolatile semiconductor memory device 110 according to this embodiment, by making the inner side face of the trench CTR of the back gate BG a curved surface, the curvature of the outer insulating film 43 can be made smaller than that of the inner insulating film 42 at the portion opposing the connection portion CP as well; the electric field EF of the outer insulating film 43 can be made lower than that of the inner insulating film 42; and the reverse injection of the electrons Cg1 toward the outer insulating film 43 can be suppressed. Thus, according to the nonvolatile semiconductor memory device 110, erroneous operations can be suppressed by suppressing reverse electron injection during the erasing in the connection portion that connects the semiconductor pillars to each other; and a nonvolatile semiconductor memory device having stable memory operations can be provided.

Thus, in the nonvolatile semiconductor memory device 110, by making the curvature of the outer insulating film 43 smaller than that of the inner insulating film 42 in the portions opposing the semiconductor pillar SP and the connection portion CP, the electric field EF of the outer insulating film 43 can be made lower than that of the inner insulating film 42 even in the case where materials having the same relative dielectric constant are used as the inner insulating film 42 and the outer insulating film 43.

In other words, in the nonvolatile semiconductor memory device 110, materials having the same relative dielectric constant may be used as the inner insulating film 42 and the outer insulating film 43. For example, the material of the inner insulating film 42 may be the same material used in the outer insulating film 43.

Conversely, when a tunneling current flows in writing/erasing operations in the case of a planar memory, the electric field applied to the blocking insulating layer has substantially the same intensity as that applied to the tunneling insulating film in the case where materials having the same relative dielectric constant are used as the blocking insulating layer and the tunneling insulating film. Therefore, current undesirably flows in the blocking insulating layer. Therefore, a phenomenon occurs, particularly when the erasing bias is applied, in which the threshold value cannot be reduced due to the reverse injection of electrons from the gate electrode. Conversely, it may be considered that the desired operations can be easily performed by using a material (e.g., aluminum oxide) as the blocking insulating layer having a relative dielectric constant higher than that of the tunneling insulating film (e.g., silicon nitride); providing a difference between the electric field of the tunneling insulating film and the electric field of the blocking insulating layer; and reducing the leak current of the blocking insulating layer. However, using a material having a high relative dielectric constant reduces the compatibility of process integration and may result in unstable operations from changes in the dielectric constant over time due to a delay of the dielectric polarization unique to materials having high relative dielectric constants.

Also, it may be considered to use the configuration of a planar MONOS cell in which, to solve the electron reverse injection problems recited above even when the same electric field is applied, the tunneling current is caused to be different between the tunneling insulating film side and the blocking insulating layer side by making the thickness of the tunneling insulating film thin enough for a direct tunneling current to flow (e.g., 3 nm (nanometers) or less) and making, on the other hand, the thickness of the blocking insulating layer at least as thick as a film (e.g., 4 nm) determined by FN current (Fowler-Nordheim emission current). However, a thin tunneling insulating film causes a large leak current at a low electric field and the emission of electrons retained in the charge storage layer due to the self-field during data retention; and retention characteristics worsen.

Conversely, as described above, in the nonvolatile semiconductor memory device 110 according to this embodiment, the inner insulating film 42 and the outer insulating film 43 are provided on the inner and outer side faces of the memory layer 48 having a pipe configuration; and an electric field difference can be generated due to the curvature difference. Therefore, constraints on the relative dielectric constant required by the outer insulating film 43 can be relaxed; the compatibility of process integration can be high, for example, for both the inner insulating film 42 and the outer insulating film 43; and silicon oxide having a high reliability can be used. Constraints on the film thicknesses of the inner insulating film 42 and the outer insulating film 43 also can be relaxed; and deterioration of retention characteristics can be suppressed.

Thus, it is desirable for the inner insulating film 42 and the outer insulating film 43 to include silicon oxide. By using silicon oxide as the inner insulating film 42 and the outer insulating film 43, the compatibility of process integration can be high and the reliability can be high while suppressing the reverse injection of electrons in the connection portion CP; and a nonvolatile semiconductor memory device having stable operations can be provided.

An example of a method for manufacturing the nonvolatile semiconductor memory device 110 will now be described.

FIGS. 7A to 7D are schematic cross-sectional views in order of the processes, illustrating the method for manufacturing the nonvolatile semiconductor memory device according to the first embodiment.

Namely, FIGS. 7A to 7D are cross-sectional views of a portion of the connection portion CP when cut in the X-Z plane.

FIGS. 8A to 8D are schematic cross-sectional views in order of the processes, illustrating the method for manufacturing the nonvolatile semiconductor memory device according to the first embodiment.

Namely, FIGS. 8A to 8D are cross-sectional views of the semiconductor pillars SP and the connection portion CP when cut in the Y-Z plane.

Figure 7A:
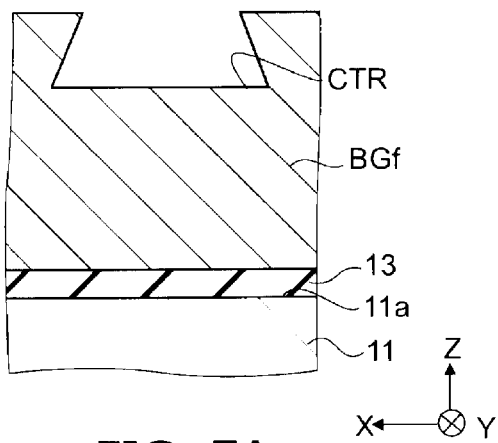
FIGS. 7A to 7D are schematic cross-sectional views in order of the processes, illustrating a method for manufacturing the nonvolatile semiconductor memory device according to the first embodiment.

As illustrated in FIG. 7A, the inter-layer insulating film 13 made of a silicon oxide film is deposited on the major surface 11a of the semiconductor substrate 11 made of silicon. Then, a conductive film BGf forming the back gate BG is deposited. The conductive film BGf may include, for example, As-doped amorphous silicon, P-doped amorphous silicon, etc. Subsequently, the trench CTR for forming the connection portion CP is made in the conductive film BGf using lithography and RIE (Reactive Ion Etching).

In such a case, a reverse taper is given to the wall faces of the trench CTR by using a high bias during the initial etching. Then, the etching conditions are changed, for example, when the depth of the trench CTR is about half of the final trench CTR depth. In other words, by performing etching with conditions for which, for example, product impurities are easily produced, the etching progresses as a film is deposited onto the side walls of the etching face.

Figure 7B:
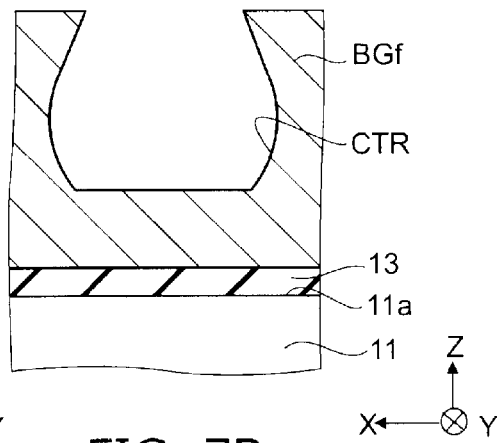

Thereby, as illustrated in FIG. 7B, the wall faces of the trench CTR have a forward taper at deep positions of the trench CTR.

Figure 7C:
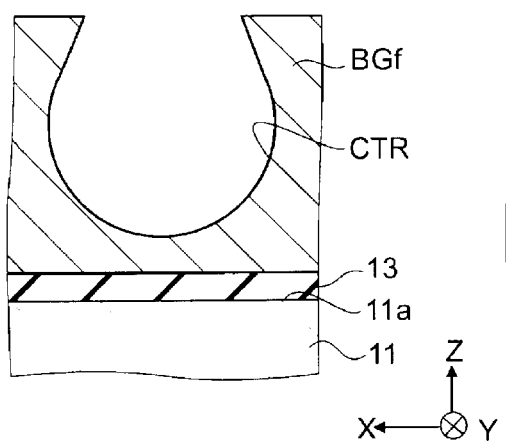

Then, as etching progresses further, as illustrated in FIG. 7C, the trench CTR can be made with wall faces having a cylindrical configuration aligned in the Y axis direction. Thus, by appropriately tuning the etching conditions, the trench CTR can be made with rounded wall faces.

Figure 7D:
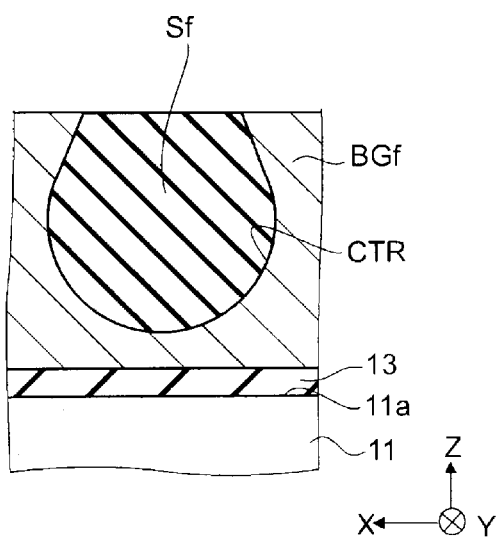

Continuing as illustrated in FIG. 7D, a sacrificial layer Sf made of, for example, a silicon nitride film is filled into the space of the interior of the trench CTR; the unnecessary sacrificial layer Sf on the surface is removed; and the surface of the conductive film BGf is exposed.

Then, an inter-layer insulating film 13b made of, for example, a silicon oxide film is formed on the conductive film BGf and the sacrificial layer Sf. The formation of the inter-layer insulating film 13b may be omitted.

Continuing as illustrated in FIG. 8A, on the inter-layer insulating film 13b, an insulating film 14f forming the inter-electrode insulating film 14 is alternately deposited with a conductive film WLf forming the electrode film WL for the desired number of repetitions; and the inter-layer insulating film 15 is deposited thereupon. The conductive film WLf may include, for example, As-doped amorphous silicon, P-doped amorphous silicon, etc. Thereby, the stacked structural unit ML is formed. Herein, the inter-layer insulating film 15 is taken to be included in the stacked structural unit ML.

Subsequently, the through-holes TH (a first through-hole TH1 and a second through-hole TH2) are made in the stacked structural unit ML by collective patterning using lithography and RIE. At this time, the through-hole TH is made to a depth reaching the sacrificial layer Sf filled into the trench CTR. Thereby, a portion of the sacrificial layer Sf is exposed.

The cross-sectional configuration of the through-hole TH is circular (including circular, elliptic, flattened circular shapes, etc.). Thereby, the curvature of the outer insulating film 43 is smaller than the curvature of the inner insulating film 42; and the electric field EF of the outer insulating film 43 can be lower than that of the inner insulating film 42.

Subsequently, as illustrated in FIG. 8B, hot phosphoric acid ($H_3PO_4$) treatment, for example, is performed to remove the sacrificial layer Sf. Thereby, a memory hole MH is made having a U-shaped configuration of two of the through-holes TH connected by the trench CTR.

Then, a stacked film made of a silicon oxide film forming the outer insulating film 43, a silicon nitride film forming the memory layer 48, and a silicon oxide film forming the inner insulating film 42 is formed in the interior of the memory hole MH (the through-holes TH and the trench CTR); and a non-doped amorphous silicon film SPf forming the semiconductor pillars SP and the connection portion CP is filled into the remaining space.

Subsequently, as illustrated in FIG. 8C, etch-back of the amorphous silicon film SPf is performed to expose a stacked film 49 made of the inner insulating film 42, the memory layer 48, and the outer insulating film 43. Then, for example, dilute hydrofluoric acid treatment and hot phosphoric acid treatment are sequentially performed to remove the exposed stacked film 49.

Then, as illustrated in FIG. 8D, the inter-layer insulating film 16, the amorphous silicon film SGf forming the selection gate electrode SG, and the inter-layer insulating film 18 are sequentially deposited. Subsequently, a selection gate hole SGH is made in these films to reach the amorphous silicon film SPf in the memory hole MH.

Subsequently, a silicon nitride film forming the selection gate insulating film SGI of the selection gate transistor is deposited onto the wall face of the inner side of the selection gate hole SGH. After removing the silicon nitride film on the bottom portion of the selection gate hole SGH by etching, amorphous silicon, for example, forming the channel of the selection gate transistor is deposited; and etch-back is performed to the desired depth.

Subsequently, after the prescribed formation of contacts and interconnect processes, the nonvolatile semiconductor memory device 110 illustrated in FIG. 1A to FIG. 5 is formed.

A nonvolatile semiconductor memory device of a variation according to this embodiment will now be described.

In a nonvolatile semiconductor memory device 111 of a variation (not illustrated), monocrystalline silicon is used as the back gate BG. A face BGS on the inner side of the back gate BG is made into a curved surface utilizing the fluidic properties of the monocrystalline silicon. Such a nonvolatile semiconductor memory device 111 may be formed, for example, as follows.

FIGS. 9A to 9H are schematic cross-sectional views in order of the processes, illustrating another method for manufacturing the nonvolatile semiconductor memory device according to the first embodiment.

As illustrated in FIG. 9A, the inter-layer insulating film 13 made of silicon oxide is deposited on the major surface 11a of the semiconductor substrate 11 made of monocrystalline silicon.

Then, as illustrated in FIG. 9B, a trench 13T is made, for example, by etching the inter-layer insulating film 13 in a peripheral portion of the memory array region MR; and a portion of the semiconductor substrate 11 is exposed.

Continuing as illustrated in FIG. 9C, after dilute hydrofluoric acid pre-treatment, an amorphous silicon film BGf1 forming the back gate BG is deposited.

Then, as illustrated in FIG. 9D, the amorphous silicon film BGf1 and the semiconductor substrate 11 are heated by, for example, laser annealing and the like; and the amorphous silicon film BGf1 is altered to become a monocrystalline silicon film BGf2 from the portion (i.e., the bottom face portion of the trench 13T) of the amorphous silicon film BGf1 contacting the semiconductor substrate 11 as crystallization progresses to reflect the crystallinity of the semiconductor substrate 11. Thus, the monocrystalline silicon film BGf2 forming the back gate BG can be formed.

Continuing as illustrated in FIG. 9E, the unnecessary monocrystalline silicon film BGf2 is removed from the portion corresponding to the trench 13T by etching to make a trench 13T1.

Then, as illustrated in FIG. 9F, an inter-layer insulating film 13c made of, for example, a silicon oxide film is filled into the trench 13T and the trench 13T1 and planarized by, for example, CMP (Chemical Mechanical Polishing) and the like. Continuing as illustrated in FIG. 9G, a trench CTR1 for forming the connection portion CP is made in the monocrystalline silicon film BGf2 using lithography and RIE. At this time, the trench CTR1 is substantially perpendicular to the wall face.

Subsequently, as illustrated in FIG. 9H, hydrogen annealing is performed, for example, in a high-temperature low-pressure atmosphere. The silicon in the monocrystalline silicon film BGf2 flows due to the hydrogen annealing; and the configuration of the trench CTR1 changes so that the surface area of the monocrystalline silicon film BGf2 is minimized. As a result, the trench CTR can be made having a configuration in which the cross section is substantially circular. In other words, at least a portion of the face BGS of the inner side of the back gate BG made of the monocrystalline silicon film BGf2 is a curved surface having a recessed configuration on the inner side.

Subsequently, after the processes described in regard to FIG. 7D and FIGS. 8A to 8D, the nonvolatile semiconductor memory device 111 of the variation according to this embodiment can be formed. In other words, the portion of the back gate BG opposing the outer insulating film 43 in the nonvolatile semiconductor memory device 111 includes monocrystalline silicon. Thereby, it is easy to make the inner side face of the trench CTR of the back gate BG into a curved surface. Then, the electric field EF of the outer insulating film 43 can be lower than that of the inner insulating film 42; the reverse electron injection in the connection portion CP during the erasing is suppressed; erroneous operations are suppressed; and the memory operations are stabilized.

Second Embodiment

A nonvolatile semiconductor memory device 120 according to a second embodiment of the invention includes the memory unit MU and the control unit CTU recited above. As described below, operations of the control unit CTU are distinctive.

The configuration and the materials described in regard to the first embodiment may be applied to the memory unit MU.

However, the inner side face of the back gate BG may be a curved surface or may be planar.

In other words, the memory unit MU includes: the stacked structural unit ML having multiple electrode films WL alternately stacked in the Z axis direction with multiple inter-electrode insulating films 14; the first semiconductor pillar SP1 piercing the stacked structural unit ML in the Z axis direction; the second semiconductor pillar SP2 adjacent to the first semiconductor pillar SP1 in the Y axis direction perpendicular to the Z axis direction and piercing the stacked structural unit ML in the Z axis direction; the connection portion CP aligned in the Y axis direction to electrically connect the first semiconductor pillar SP1 and the second semiconductor pillar SP2 on the same side in the Z axis direction; the back gate BG provided to oppose the connection portion CP; the memory layer 48 provided between the first semiconductor pillar SP1 and each of the electrode films WL, between the second semiconductor pillar SP2 and each of the electrode films WL, and between the connection portion CP and the back gate BG; the inner insulating film 42 provided between the memory layer 48 and the first semiconductor pillar SP1, between the memory layer 48 and the second semiconductor pillar SP2, and between the memory layer 48 and the connection portion CP; the outer insulating film 43 provided between the memory layer 48 and each of the electrode films WL and between the memory layer 48 and the back gate BG; and the interconnect WR electrically connected to one end of at least one selected from the first and second semiconductor pillars SP1 and SP2.

Thus, in the nonvolatile semiconductor memory device 120, the inner side face of the back gate BG may be a curved surface or, for example, may be planar as in the nonvolatile semiconductor memory device 119 of the comparative example illustrated in FIG. 6E. In other words, the relationship between the curvature of the inner insulating film 42 and the curvature of the outer insulating film 43 at the portion opposing the connection portion CP is arbitrary. Although structurally, the electric field applied to the outer insulating film 43 is not always lower than the electric field applied to the inner insulating film 42 at the portion opposing the connection portion CP, the reverse injection of electrons is suppressed by the control unit CTU controlling the potential of the back gate BG.

Operations of the control unit CTU will now be described.

Figure 10:
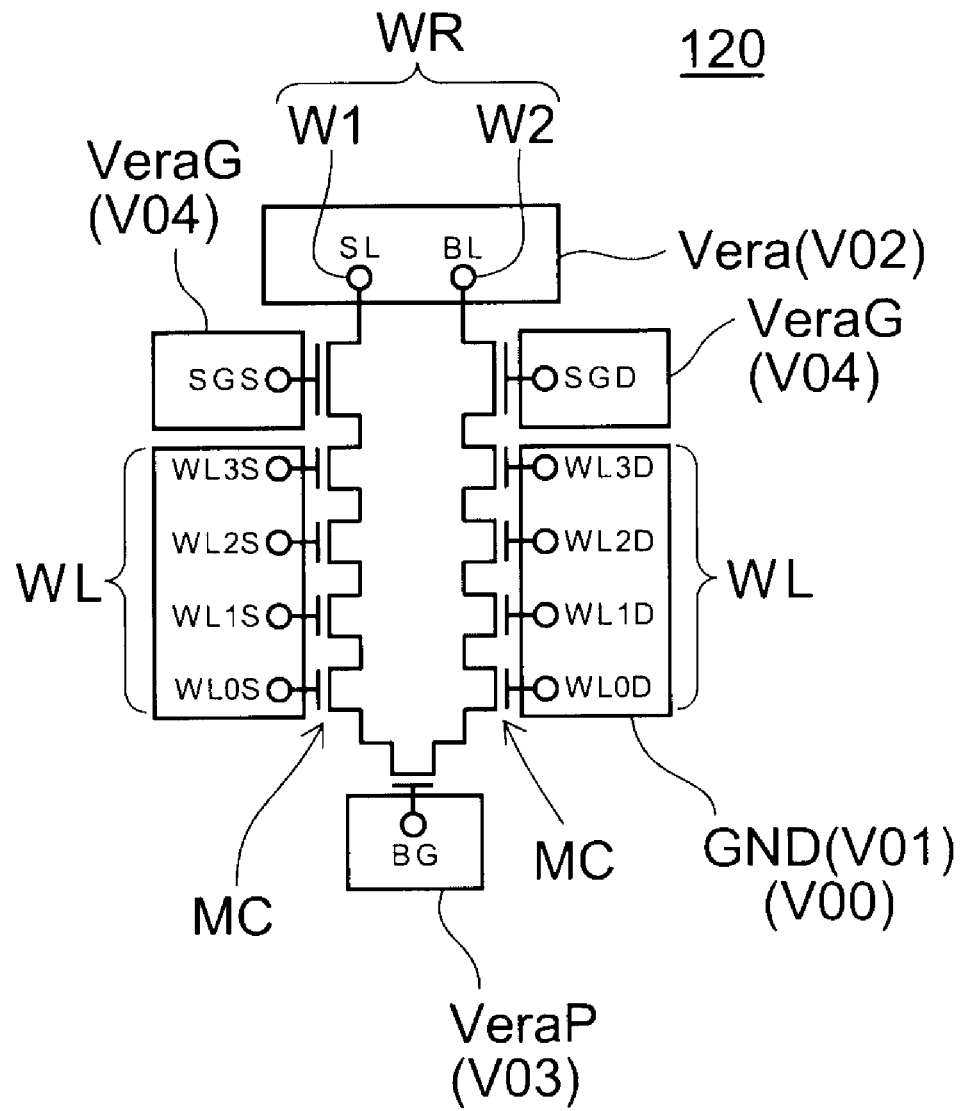
FIG. 10 is a schematic view illustrating operations of a nonvolatile semiconductor memory device according to a second embodiment.

FIG. 10 is a schematic view illustrating operations of the nonvolatile semiconductor memory device according to the second embodiment.

FIGS. 11A to 11E are schematic views illustrating operations of the nonvolatile semiconductor memory device according to the second embodiment.

Namely, FIGS. 11A, 11B, 11C, 11D, and 11E illustrate the potential (a potential VBL of the bit line BL and a potential VSL of the source line SL) of the interconnect WR, the potential (a potential VSGD of the drain-side selection gate electrode SGD and a potential VSGS of the source-side selection gate electrode SGS) of the selection gate electrode SG, a potential VWL of the electrode film WL, a potential VBG of the back gate BG, and a potential VCH of the interior of the channel layer (the connection portion CP and the semiconductor pillar SP), respectively. Time t is plotted on the horizontal axis in these drawings.

In the nonvolatile semiconductor memory device 120, in the erasing operation (the operation of performing at least one selected from injecting electron holes into the memory layer 48 and removing electrons from the memory layer 48), the control unit CTU applies a positive polarity back gate voltage VeraP of the erasing to the back gate BG as illustrated in FIGS. 11A to 11E.

In the nonvolatile semiconductor memory device 120, the channel layer (the semiconductor pillar SP and the connection portion CP) is not connected to the semiconductor substrate 11. Therefore, it is difficult to employ an erasing operation as in a planar NAND memory in which the voltage of the semiconductor substrate 11 (e.g., a P well) is increased. Therefore, a GIDL (Gate-Induced-Drain-Leakage) current is generated, for example, in an end portion of the selection gate electrode SG; and the potential of the channel layer is increased by holes generated thereby being transferred into the interior of the channel layer.

Specifics, for example, are performed as follows. That is, the control unit CTU of the nonvolatile semiconductor memory device 120 has a circuit that outputs signals described below.

Namely, in the erasing operation, the control unit CTU sets the electrode film WL to, for example, a grounding potential GND (i.e., a reference potential V00 of, for example, 0 volts) and applies an erasing voltage Vera to the interconnect WR, where the erasing voltage Vera is a positive polarity voltage having the reference potential V00 as a reference. In other words, the control unit CTU sets the interconnect WR to a second potential V02 higher than the reference potential V00 while setting the electrode film WL to a first potential V01.

Then, the control unit CTU applies the positive polarity back gate voltage VeraP of the erasing to the back gate BG. In other words, the control unit CTU sets the back gate BG to a third potential V03 higher than the first potential V01.

Further, the control unit CTU applies a positive polarity voltage, i.e., a selection gate voltage VeraG of the erasing having a maximum value lower than the maximum value of the erasing voltage Vera, to the source-side selection gate electrode SGS and the drain-side selection gate electrode SGD. In other words, the control unit CTU sets the source-side selection gate electrode SGS and the drain-side selection gate electrode SGD to a fourth potential V04, which is higher than the first potential V01 and lower than the second potential V02.

In other words, as illustrated in FIG. 11A, the erasing voltage Vera increases from the reference potential V00 at a time t11, reaches the second potential V02, subsequently decreases, and returns to the reference potential V00 at a time t14. The maximum value of the erasing voltage Vera (i.e., the difference between the second potential V02 and the reference potential V00) is, for example, 20 V (volts).

As illustrated in FIG. 11B, the selection gate voltage VeraG of the erasing increases from the reference potential V00 at a time t12, reaches the fourth potential V04, subsequently decreases, and returns to the reference potential V00 at a time t13. The maximum value of the selection gate voltage VeraG of the erasing (i.e., the difference between the fourth potential V04 and the reference potential V00) is, for example, 15 V.

As illustrated in FIG. 11C, the potential VWL of the electrode film WL is constant at the reference potential V00.

As illustrated in FIG. 11D, the back gate voltage VeraP of the erasing increases from the reference potential V00 at a time after the time t11, reaches the third potential V03, subsequently decreases, and returns to the reference potential V00 at a time prior to the time t14. The maximum value (i.e., the difference between the third potential V03 and the reference potential V00) of the back gate voltage VeraP of the erasing may be set to any value not more than the maximum value of the erasing voltage Vera. Because leaks and the like, for example, may occur between the back gate and the gate located immediately on the back gate when the back gate voltage VeraP of the erasing is too great, it is more favorable for the maximum value (the difference between the third potential V03 and the reference potential V00) of the back gate voltage VeraP of the erasing to be set, for example, not more than about 10 V.

As illustrated in FIG. 11E, the potential VCH of the channel layer interior increases from the reference potential V00 to, for example, a value of a potential VC. In other words, because the erasing voltage Vera applied to the interconnect WR is higher than the selection gate voltage VeraG of the erasing applied to the selection gate electrode SG, a GIDL current is generated proximally to the end portion of the selection gate electrode SG; and holes flow into the channel layer. Thereby, the potential VCH of the channel layer interior increases. At this time, the maximum value (the potential VC) of the potential VCH of the channel layer interior is a voltage substantially same as the second potential V02 or slightly smaller than the second potential V02.

As illustrated in FIG. 11E, a potential difference ΔV, i.e., the difference between the potential VCH (the potential VC) of the channel layer interior and the back gate voltage VeraP (the third potential V03) of the back gate BG, is applied between the connection portion CP and the back gate BG. The potential difference ΔV is smaller than the potential VCH by the amount of the back gate voltage VeraP of the erasing.

In the case of, for example, a comparative example in which the back gate voltage VeraP of the erasing is not applied to the back gate BG and the back gate BG is set to the same potential as the electrode film WL, the potential VBG of the back gate BG is the reference potential V00; and the maximum value of the potential difference ΔV is large, i.e., the difference between the potential VC and the reference potential V00. Therefore, there is a possibility that reverse injection of electrons in the connection portion CP may occur and erroneous operations may occur simultaneously with the collective erasing of the memory cells MC provided corresponding to the electrode films WL.

Conversely, in the nonvolatile semiconductor memory device 120, the positive polarity back gate voltage VeraP of the erasing is applied to the back gate BG. Therefore, the potential difference ΔV can be smaller than that of the comparative example by the amount of the back gate voltage VeraP of the erasing. Thereby, the electric field applied to the outer insulating film 43 can be sufficiently reduced and the reverse electron injection in the connection portion is suppressed during the erasing. Thereby, erroneous operations are suppressed; and memory operations are stable.

A difference between the erasing voltage Vera and the selection gate voltage VeraG of the erasing is a value lower than the breakdown voltage of the selection gate transistor of the selection gate electrode SG. The time t12 is a time not prior to the time t11. The time t13 is a time not posterior to the time t14.

In other words, the control unit CTU implements: a pulse increase operation causing a potential of the selection gate electrode SG to start to change from a selection gate low potential toward a selection gate high potential higher than the selection gate low potential not prior to causing a potential of the interconnect WR to start to change from an interconnect low potential toward an interconnect high potential higher than the interconnect low potential; and a pulse reduction operation causing a potential of the interconnect WR to finish changing from the interconnect high potential toward the interconnect low potential not prior to causing a potential of the selection gate electrode SG to finish changing from the selection gate high potential toward the selection gate low potential after the pulse increase operation.

In other words, the erasing voltage Vera is not less than the value of the selection gate voltage VeraG of the erasing at any time. By applying such a selection gate voltage VeraG of the erasing to the drain-side selection gate electrode SGD and the source-side selection gate electrode SGS, gate breakdown of the selection gate transistor does not occur; a GIDL current is generated in the semiconductor pillar SP proximally to the portion opposing the drain-side selection gate electrode SGD and the source-side selection gate electrode SGS; and the operations recited above can be executed.

Although the source line SL and the bit line BL connected to either end of the semiconductor pillar SP having the U-shaped configuration in this specific example both are set to the same potential, the invention is not limited thereto. In other words, as described below, the interconnect WR (one selected from the source line SL and the bit line BL) connected to one end of the semiconductor pillar SP may be set to a prescribed potential; and the other end (the one not selected from the source line SL and the bit line BL) may be set to a floating state.

In other words, the interconnect WR includes: a first interconnect W1 electrically connected to one end of the first semiconductor pillar SP1; and a second interconnect W2 electrically connected to one end of the second semiconductor pillar SP2. The selection gate electrode SG includes: a first selection gate electrode SG1 stacked on the stacked structural unit ML in the first direction and pierced by the first semiconductor pillar SP1 on the first interconnect W1 side; and a second selection gate electrode SG2 stacked on the stacked structural unit ML in the first direction and pierced by the second semiconductor pillar SP2 on the second interconnect W2 side.

The control unit CTU, in the operation of performing at least one selected from injecting electron holes into the memory layer 48 and removing electrons from the memory layer 48, implements: setting the first selection gate electrode SG1 to a potential higher than a potential of the electrode film WL and lower than a potential of the first interconnect W1 while setting the first interconnect W1 to a potential higher than a potential of the electrode film WL; setting the second interconnect W2 to a floating state FLT; and one selected from setting the second selection gate electrode SG2 to the potential higher than a potential of the electrode film WL and lower than a potential of the first interconnect W1 and setting the second selection gate electrode SG2 to the floating state FLT.

Figure 12:
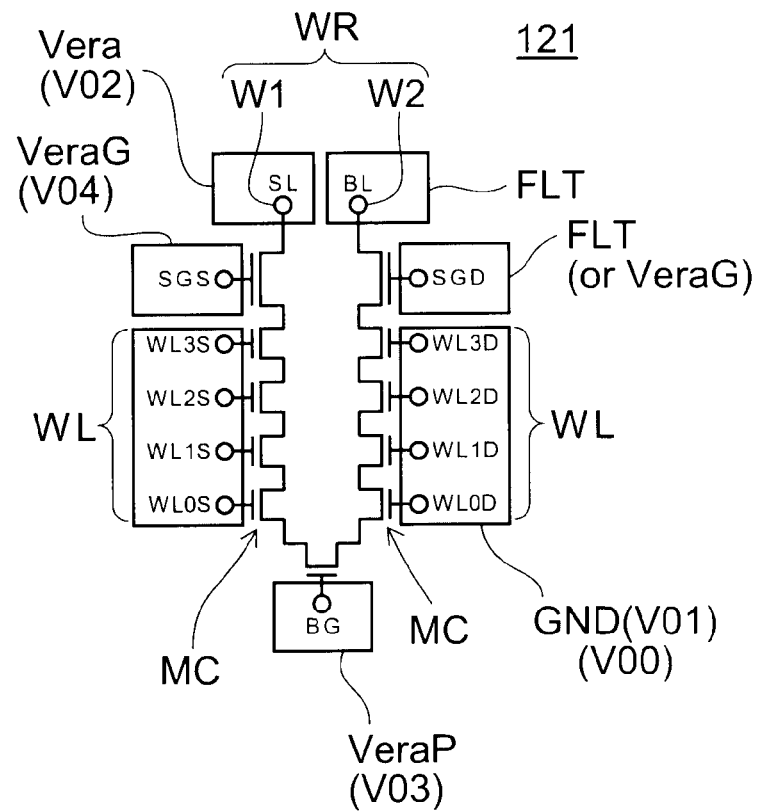
FIG. 12 is a schematic view illustrating other operations of the nonvolatile semiconductor memory device according to the second embodiment.

FIG. 12 is a schematic view illustrating other operations of the nonvolatile semiconductor memory device according to the second embodiment.

In another nonvolatile semiconductor memory device 121, the erasing voltage Vera is applied to one of the interconnects WR (the first interconnect W1 and in this case, the source line SL); and one other of the interconnects WR (the second interconnect W2 and in this case, the bit line BL) is set to the floating state FLT as illustrated in FIG. 12.

The selection gate voltage VeraG of the erasing is applied to the source-side selection gate electrode SGS; and the drain-side selection gate electrode SGD is set to the floating state FLT. Alternatively, the selection gate voltage VeraG of the erasing may be applied to both the source-side selection gate electrode SGS and the drain-side selection gate electrode SGD.

The electrode film WL is set to the grounding potential GND (the reference potential V00).

In such a case as well, the back gate voltage VeraP of the erasing is applied to the back gate BG.

In such a case as well, the potential difference ΔV between the connection portion CP and the back gate BG can be reduced by the amount of the back gate voltage VeraP of the erasing. Thereby, the electric field applied to the outer insulating film 43 can be sufficiently reduced and the reverse electron injection in the connection portion is suppressed during the erasing. Thereby, erroneous operations are suppressed; and the memory operations are stable.

Third Embodiment

A nonvolatile semiconductor memory device 130 according to a third embodiment of the invention includes the memory unit MU and the control unit CTU recited above. The configurations thereof may be similar to that of the nonvolatile semiconductor memory device 120 according to the second embodiment, and a description is omitted. As described below, operations of the control unit CTU differ from those of the second embodiment.

Figure 13:
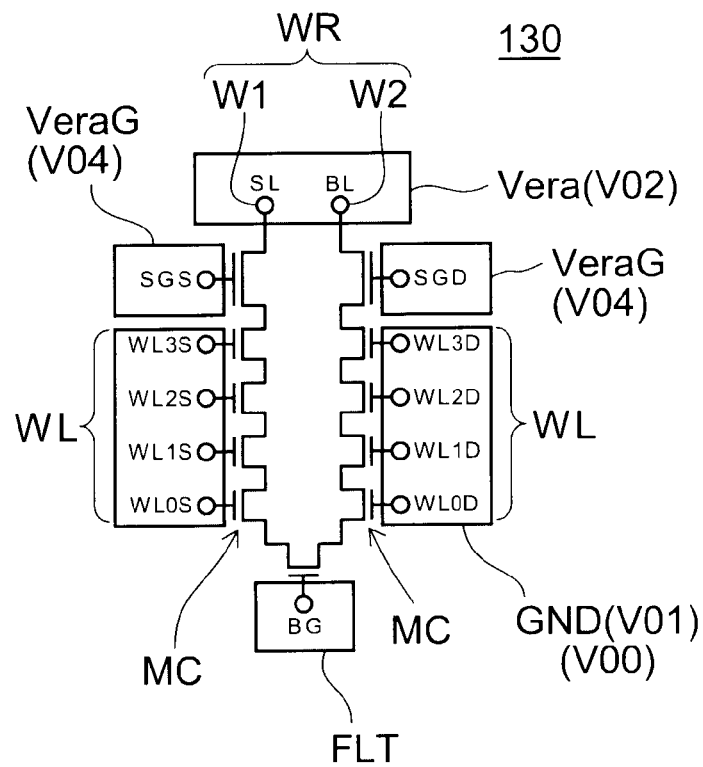
FIG. 13 is a schematic view illustrating operations of a nonvolatile semiconductor memory device according to a third embodiment.

FIG. 13 is a schematic view illustrating operations of the nonvolatile semiconductor memory device according to the third embodiment.

FIGS. 14A to 14E are schematic views illustrating the operations of the nonvolatile semiconductor memory device according to the third embodiment.

Namely, FIGS. 14A, 14B, 14C, 14D, and 14E illustrate the potential (the potential VBL of the bit line BL and the potential VSL of the source line SL) of the interconnect WR, the potential (the potential VSGD of the drain-side selection gate electrode SGD and the potential VSGS of the source-side selection gate electrode SGS) of the selection gate electrode SG, the potential VWL of the electrode film WL, the potential VBG of the back gate BG, and the potential VCH of the interior of the channel layer (the connection portion CP and the semiconductor pillar SP), respectively. The time t is plotted on the horizontal axis in these drawings.

In the nonvolatile semiconductor memory device 130, in the erasing operation (the operation of performing at least one selected from injecting electron holes into the memory layer 48 and removing electrons from the memory layer 48), the control unit CTU sets the back gate BG to the floating state FLT as illustrated in FIG. 13. For example, the control unit CTU has a switch and the like to set the interconnect connected to the back gate BG to a nonconducting state.

Thereby, the control unit CTU performs, for example, as follows.

Namely, in the erasing operation, the control unit CTU sets the electrode film WL to, for example, the grounding potential GND (the reference potential V00) and applies the erasing voltage Vera to the interconnect WR. In other words, the control unit CTU sets the interconnect WR to the second potential V02 higher than the first potential V01 while setting the electrode film WL to the first potential V01.

The control unit CTU sets the back gate BG to the floating state FLT.

Further, the control unit CTU applies the selection gate voltage VeraG of the erasing to the source-side selection gate electrode SGS and the drain-side selection gate electrode SGD. In other words, the control unit CTU sets the source-side selection gate electrode SGS and the drain-side selection gate electrode SGD to the fourth potential V04, which is higher than the first potential V01 and lower than the second potential V02.

In other words, as illustrated in FIGS. 14A and 14B, the erasing voltage Vera and the selection gate voltage VeraG of the erasing similar to those described in regard to FIGS. 12A and 12B are used. As illustrated in FIG. 14C, the potential VWL of the electrode film WL is set to the reference potential V00 similarly to that of FIG. 12C.

As illustrated in FIG. 14D, the back gate BG is set to the floating state FLT. Thereby, the potential VBG of the back gate BG increases to a potential VB due to capacitive coupling.

In such a case as well, as illustrated in FIG. 14E, the potential VCH of the channel layer interior increases due to a GIDL current to a value of, for example, the potential VC.

As illustrated in FIG. 14E, the potential difference ΔV, i.e., the difference between the potential VCH (the potential VC) of the channel layer interior and the potential VBG (the potential VB) of the back gate BG, is applied between the connection portion CP and the back gate BG. The potential difference ΔV is smaller than the potential VCH of the channel interior by the amount that the potential VB increases due to the capacitive coupling.

Thus, in the nonvolatile semiconductor memory device 130, the back gate BG is set to the floating state FLT; and the potential difference ΔV can be smaller than that of the comparative example by the amount of the potential VB because the potential VBG of the back gate BG increases to the potential VB due to the capacitive coupling. Thereby, the electric field applied to the outer insulating film 43 can be sufficiently reduced and the reverse electron injection in the connection portion is suppressed during the erasing. Thereby, erroneous operations are suppressed; and memory operations are stable.

As described above, because the erasing voltage Vera is never less than the selection gate voltage VeraG of the erasing, gate breakdown of the selection gate transistor does not occur; a GIDL current is generated in the semiconductor pillar SP proximal to the portion opposing the drain-side selection gate electrode SGD and the source-side selection gate electrode SGS; and the operations recited above can be executed.

Figure 15:
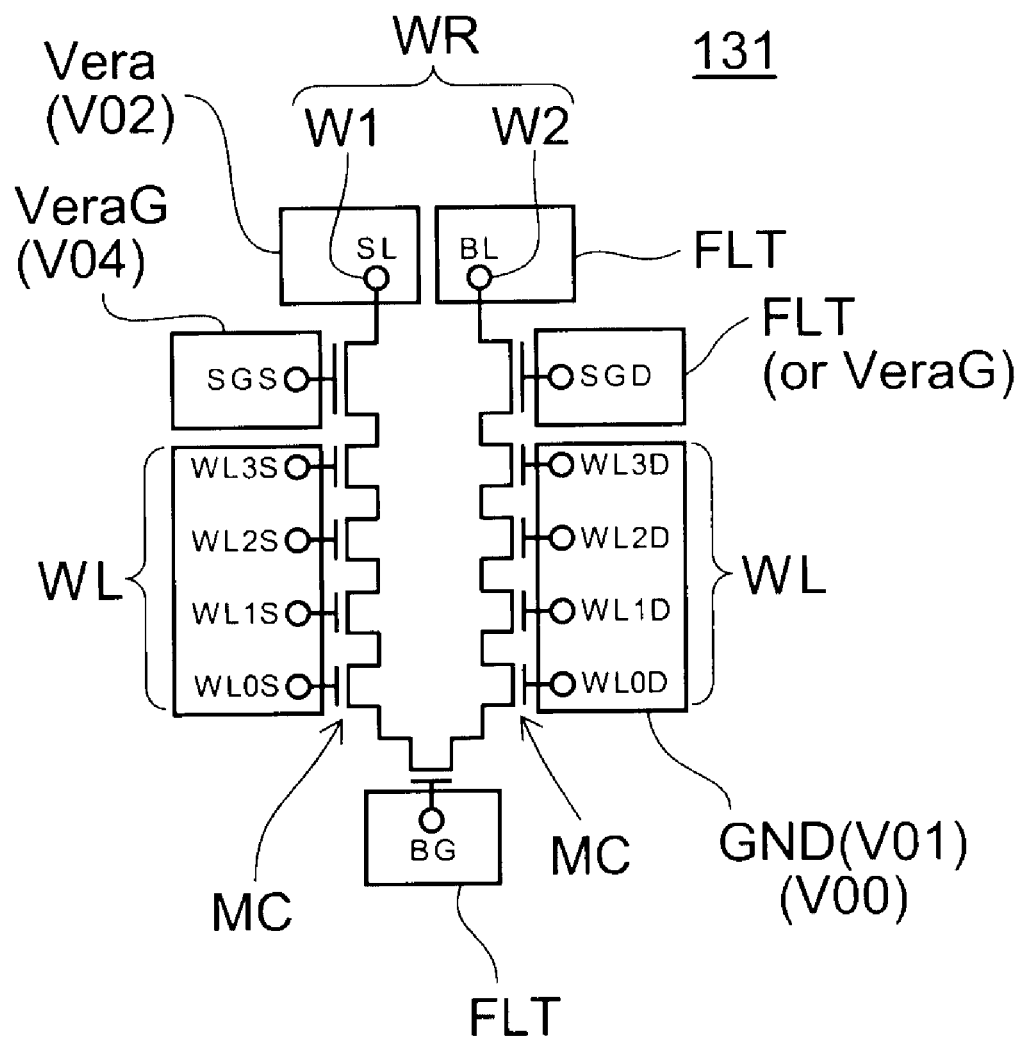
FIG. 15 is a schematic view illustrating other operations of the nonvolatile semiconductor memory device according to the third embodiment.

FIG. 15 is a schematic view illustrating other operations of the nonvolatile semiconductor memory device according to the third embodiment.

In a nonvolatile semiconductor memory device 131 performing other operations, the erasing voltage Vera is applied to one of the interconnects WR (the first interconnect W1 and in this case, the source line SL); and one other of the interconnects WR (the second interconnect W2 and in this case, the bit line BL) is set to the floating state FLT as illustrated in FIG. 15.

The selection gate voltage VeraG of the erasing is applied to the source-side selection gate electrode SGS; and the drain-side selection gate electrode SGD is set to the floating state FLT. Alternatively, the selection gate voltage VeraG may be applied to both the source-side selection gate electrode SGS and the drain-side selection gate electrode SGD.

The electrode film WL is set to the grounding potential GND (the reference potential V00).

In such a case as well, the back gate BG is set to the floating state FLT.

Thus, the interconnect WR (one selected from the source line SL and the bit line BL) connected to one end of the semiconductor pillar SP may be set to a prescribed potential (the erasing voltage Vera); and the other end (the one not selected from the source line SL and the bit line BL) may be set to the floating state.

In such a case as well, the potential VBG of the back gate BG increases to the potential VB due to the capacitive coupling. Thereby, the electric field applied to the outer insulating film 43 can be sufficiently reduced and the reverse electron injection in the connection portion is suppressed during the erasing. Thereby, erroneous operations are suppressed; and the memory operations are stable.

In the nonvolatile semiconductor memory devices according to the embodiments of the invention, the inter-electrode insulating film 14, the inner insulating film 42, and the outer insulating film 43 may include a single-layer film or a stacked film, the single-layer film being one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

The memory layer 48 may include a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

The second embodiment recited above may be taken to be an embodiment of a method for driving the nonvolatile semiconductor memory device. In other words, a method of driving the nonvolatile semiconductor memory device may be provided in which the back gate BG is set to a potential higher than that of the electrode film in the erasing operation of a nonvolatile semiconductor memory device having the memory unit MU recited above.

The third embodiment recited above also may be taken to be an embodiment of a method for driving the nonvolatile semiconductor memory device. In other words, a method of driving the nonvolatile semiconductor memory device may be provided in which the back gate BG is set to the floating state FLT in the erasing operation of a nonvolatile semiconductor memory device having the memory unit MU recited above.

In each of these driving methods, the selection gate electrode SG may be set to a potential, which is higher than the potential of the electrode film WL and lower than the potential of the interconnect WR, while setting the interconnect WR to a potential higher than that of the electrode film WL, where the selection gate electrode SG is stacked on the stacked structural unit ML in the Z axis direction and pierced by the semiconductor pillar SP on the one end side where the interconnect WR is provided. Thereby, a GIDL current can be effectively generated.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as semiconductor substrates, electrode films, insulating films, insulating layers, stacked structural units, memory layers, charge storage layers, semiconductor pillars, word lines, bit lines, source lines, interconnects, memory cell transistors, selection gate transistors, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices practicable by an appropriate design modification by one skilled in the art based on the nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A nonvolatile semiconductor memory device, comprising:
a stacked structural unit including a plurality of electrode films alternately stacked in a first direction with a plurality of inter-electrode insulating films;
a first semiconductor pillar piercing the stacked structural unit in the first direction;
a second semiconductor pillar adjacent to the first semiconductor pillar in a second direction perpendicular to the first direction, the second semiconductor pillar piercing the stacked structural unit in the first direction;
a connection portion semiconductor layer aligned in the second direction to electrically connect the first semiconductor pillar and the second semiconductor pillar on a same side in the first direction;
a connection portion conductive layer provided to oppose the connection portion semiconductor layer;
a memory layer provided between the first semiconductor pillar and each of the electrode films, between the second semiconductor pillar and each of the electrode films, and between the connection portion conductive layer and the connection portion semiconductor layer;
an inner insulating film provided between the memory layer and the first semiconductor pillar, between the memory layer and the second semiconductor pillar, and between the memory layer and the connection portion semiconductor layer; and
an outer insulating film provided between the memory layer and each of the electrode films and between the memory layer and the connection portion conductive layer,
at least a portion of a face of the connection portion conductive layer opposing the outer insulating film being a curved surface having a recessed configuration on a side of the outer insulating film.

2. The device according to claim 1, wherein a bottom face of the connection portion conductive layer on a side opposite to the stacked structural unit and a side face of the connection portion conductive layer are a portion of a side face of a cylinder having an axis parallel to the second direction.

3. The device according to claim 1, wherein a curvature of a portion of the outer insulating film opposing the connection portion conductive layer is smaller than a curvature of a portion of the inner insulating film opposing the connection portion semiconductor layer.

4. The device according to claim 1, wherein an electric field applied to a portion of the outer insulating film opposing the connection portion conductive layer is lower than an electric field applied to a portion of the inner insulating film opposing the connection portion semiconductor layer.

5. The device according to claim 1, wherein
a cross section of the first semiconductor pillar and a cross section of the second semiconductor pillar cut in a plane perpendicular to the first direction have a circular shape or a flattened circular shape, and
a curvature of a portion of the outer insulating film opposing the electrode films is smaller than a curvature of a portion of the inner insulating film opposing the first semiconductor pillar and a curvature of a portion of the inner insulating film opposing the second semiconductor pillar.

6. The device according to claim 1, wherein a relative dielectric constant of a material of the inner insulating film is substantially equal to a relative dielectric constant of a material of the outer insulating film.

7. The device according to claim 1, wherein the inner insulating film and the outer insulating film include silicon oxide.

8. The device according to claim 7, wherein the memory layer includes a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

9. The device according to claim 1, wherein at least a portion of the connection portion conductive layer opposing the outer insulating film includes monocrystalline silicon.

10. The device according to claim 1, wherein the connection portion conductive layer has a curved surface formed by flowing a wall face of a trench made in a monocrystalline silicon film.

11. A nonvolatile semiconductor memory device, comprising a memory unit and a control unit,
the memory unit including:
a stacked structural unit having a plurality of electrode films alternately stacked in a first direction with a plurality of inter-electrode insulating films;

a first semiconductor pillar piercing the stacked structural unit in the first direction;
a second semiconductor pillar adjacent to the first semiconductor pillar in a second direction perpendicular to the first direction, the second semiconductor pillar piercing the stacked structural unit in the first direction;
a connection portion semiconductor layer aligned in the second direction to electrically connect the first semiconductor pillar and the second semiconductor pillar on a same side in the first direction;
a connection portion conductive layer provided to oppose the connection portion semiconductor layer;
a memory layer provided between the first semiconductor pillar and each of the electrode films, between the second semiconductor pillar and each of the electrode films, and between the connection portion conductive layer and the connection portion semiconductor layer;
an inner insulating film provided between the memory layer and the first semiconductor pillar, between the memory layer and the second semiconductor pillar, and between the memory layer and the connection portion semiconductor layer;
an outer insulating film provided between the memory layer and each of the electrode films and between the memory layer and the connection portion conductive layer; and
an interconnect electrically connected to one end of at least one selected from the first and second semiconductor pillars,
the control unit, in an operation of performing at least one selected from injecting an electron hole into the memory layer and removing an electron from the memory layer, sets the connection portion conductive layer to a potential higher than a potential of the electrode films.

12. The device according to claim 11, wherein:
the memory unit further includes a selection gate electrode stacked in the first direction on the stacked structural unit and pierced by the semiconductor pillar on a side of the one end; and
the control unit, in the operation of performing at least one selected from injecting an electron hole into the memory layer and removing an electron from the memory layer, sets the selection gate electrode to a potential higher than the potential of the electrode films and lower than a potential of the interconnect while setting the interconnect to a potential higher than the potential of the electrode films.

13. The device according to claim 11, wherein a difference between the potential of the electrode films and the set potential of a selection gate electrode is lower than a breakdown voltage of a selection gate transistor formed at an intersection between the selection gate electrode and the at least one selected from the first semiconductor pillar and the second semiconductor pillar.

14. The device according to claim 11, wherein the control unit implements:
a pulse increase operation causing a potential of a selection gate electrode to start changing from a selection gate low potential toward a selection gate high potential higher than the selection gate low potential not prior to causing a potential of the interconnect to start changing from an interconnect low potential toward an interconnect high potential higher than the interconnect low potential; and
a pulse reduction operation causing the potential of the interconnect to finish changing from the interconnect high potential toward the interconnect low potential not prior to causing the potential of the selection gate electrode to finish changing from the selection gate high potential toward the selection gate low potential after the pulse increase operation.

15. The device according to claim 11, wherein
the interconnect includes:
a first interconnect electrically connected to one end of the first semiconductor pillar; and
a second interconnect electrically connected to one end of the second semiconductor pillar,
a selection gate electrode includes:
a first selection gate electrode stacked in the first direction on the stacked structural unit and pierced by the first semiconductor pillar on a side of the first interconnect; and
a second selection gate electrode stacked in the first direction on the stacked structural unit and pierced by the second semiconductor pillar on a side of the second interconnect, and
the control unit, in the operation of performing at least one selected from injecting an electron hole into the memory layer and removing an electron from the memory layer, implements:
setting the first selection gate electrode to a potential higher than the potential of the electrode films and lower than a potential of the first interconnect while setting the first interconnect to a potential higher than the potential of the electrode films;
setting the second interconnect to a floating state; and
one selected from setting the second selection gate electrode to the potential higher than the potential of the electrode films and lower than the potential of the first interconnect and setting the second selection gate electrode to a floating state.

16. A nonvolatile semiconductor memory device, comprising a memory unit and a control unit,
the memory unit including:
a stacked structural unit having a plurality of electrode films alternately stacked in a first direction with a plurality of inter-electrode insulating films;
a first semiconductor pillar piercing the stacked structural unit in the first direction;
a second semiconductor pillar adjacent to the first semiconductor pillar in a second direction perpendicular to the first direction, the second semiconductor pillar piercing the stacked structural unit in the first direction;
a connection portion semiconductor layer aligned in the second direction to electrically connect the first semiconductor pillar and the second semiconductor pillar on a same side in the first direction;
a connection portion conductive layer provided to oppose the connection portion semiconductor layer;
a memory layer provided between the first semiconductor pillar and each of the electrode films, between the second semiconductor pillar and each of the electrode films, and between the connection portion conductive layer and the connection portion semiconductor layer;
an inner insulating film provided between the memory layer and the first semiconductor pillar, between the memory layer and the second semiconductor pillar, and between the memory layer and the connection portion semiconductor layer;

an outer insulating film provided between the memory layer and each of the electrode films and between the memory layer and the connection portion conductive layer; and an interconnect electrically connected to one end of at least one selected from the first and second semiconductor pillars, the control unit, in an operation of performing at least one selected from injecting an electron hole into the memory layer and removing an electron from the memory layer, sets the connection portion conductive layer to a floating state.

17. The device according to claim 16, wherein:

the memory unit further includes a selection gate electrode stacked in the first direction on the stacked structural unit and pierced by the semiconductor pillar on a side of the one end; and the control unit, in the operation of performing at least one selected from injecting an electron hole into the memory layer and removing an electron from the memory layer, sets the selection gate electrode to a potential higher than the potential of the electrode films and lower than a potential of the interconnect while setting the interconnect to a potential higher than the potential of the electrode films.

18. The device according to claim 16, wherein a difference between the potential of the electrode films and the set potential of a selection gate electrode is lower than a breakdown voltage of a selection gate transistor formed at an intersection between the selection gate electrode and the at least one selected from the first semiconductor pillar and the second semiconductor pillar.

19. The device according to claim 16, wherein the control unit implements:

a pulse increase operation causing a potential of a selection gate electrode to start changing from a selection gate low potential toward a selection gate high potential higher than the selection gate low potential not prior to causing a potential of the interconnect to start changing from an interconnect low potential toward an interconnect high potential higher than the interconnect low potential; and a pulse reduction operation causing the potential of the interconnect to finish changing from the interconnect high potential toward the interconnect low potential not prior to causing the potential of the selection gate electrode to finish changing from the selection gate high potential toward the selection gate low potential after the pulse increase operation.

20. The device according to claim 16, wherein the interconnect includes:
    a first interconnect electrically connected to one end of the first semiconductor pillar; and
    a second interconnect electrically connected to one end of the second semiconductor pillar, a selection gate electrode includes:
    a first selection gate electrode stacked in the first direction on the stacked structural unit and pierced by the first semiconductor pillar on a side of the first interconnect; and
    a second selection gate electrode stacked in the first direction on the stacked structural unit and pierced by the second semiconductor pillar on a side of the second interconnect, and the control unit, in the operation of performing at least one selected from injecting an electron hole into the memory layer and removing an electron from the memory layer, implements:
    setting the first selection gate electrode to a potential higher than the potential of the electrode films and lower than a potential of the first interconnect while setting the first interconnect to a potential higher than the potential of the electrode films;
    setting the second interconnect to a floating state; and
    one selected from setting the second selection gate electrode to the potential higher than the potential of the electrode films and lower than the potential of the first interconnect and setting the second selection gate electrode to a floating state.

* * * * *